| (12) | United States Patent | (10) Patent No.: | US 8,552,570 B2 |
|---|---|---|---|
| | Kikuchi et al. | (45) Date of Patent: | Oct. 8, 2013 |

(54) WIRING BOARD, SEMICONDUCTOR DEVICE, AND METHOD FOR MANUFACTURING WIRING BOARD AND SEMICONDUCTOR DEVICE

(75) Inventors: Katsumi Kikuchi, Tokyo (JP); Shintaro Yamamichi, Tokyo (JP); Masaya Kawano, Kanagawa (JP); Kouji Soejima, Kanagawa (JP); Yoichiro Kurita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 403 days.

(21) Appl. No.: 12/811,733

(22) PCT Filed: Jan. 6, 2009

(86) PCT No.: PCT/JP2009/050046
§ 371 (c)(1),
(2), (4) Date: Aug. 3, 2010

(87) PCT Pub. No.: WO2009/088000
PCT Pub. Date: Jul. 16, 2009

(65) Prior Publication Data
US 2010/0295191 A1  Nov. 25, 2010

(30) Foreign Application Priority Data
Jan. 9, 2008 (JP) ................................. 2008-002341

(51) Int. Cl.
*H01L 29/40* (2006.01)

(52) U.S. Cl.
USPC ............ 257/784; 257/E21.509; 257/E23.024; 438/121; 174/266; 29/825

(58) Field of Classification Search
USPC ........... 257/784, E21.509, E23.024; 438/121; 174/266
See application file for complete search history.

(56) References Cited

U.S. PATENT DOCUMENTS

2006/0102384 A1* 5/2006 Watanabe et al. ............. 174/256
2010/0295191 A1* 11/2010 Kikuchi et al. ............... 257/784

FOREIGN PATENT DOCUMENTS

| JP | 8-88470 A | 4/1996 |
|---|---|---|
| JP | 2001196496 A | 7/2001 |
| JP | 2004006576 A | 1/2004 |
| JP | 2004079756 A | 3/2004 |

(Continued)

OTHER PUBLICATIONS

International Search Report for PCT/JP2009/050046 mailed Feb. 17, 2009.

(Continued)

*Primary Examiner* — Eugene Lee
*Assistant Examiner* — Elias M Ullah
(74) *Attorney, Agent, or Firm* — Young & Thompson

(57) ABSTRACT

In the wiring board, insulating layers and wiring layers are alternately laminated, and the wiring layers are electrically connected by the vias. The wiring board includes first terminals arranged in a first surface and embedded in an insulating layer, second terminals arranged in a second surface opposite to the first surface and embedded in an insulating layer, and lands arranged in an insulating layer and in contact with the first terminals. The vias electrically connect the lands and the wiring layers laminated alternately with the insulating layers. No connecting interface is formed at an end of each of the vias on the land side but a connecting interface is formed at an end of each of the vias on the wiring layer side.

13 Claims, 19 Drawing Sheets

(56) References Cited

FOREIGN PATENT DOCUMENTS

| | | | |
|---|---|---|---|
| JP | 2004179647 A | 6/2004 | |
| JP | 2004200668 A | 7/2004 | |
| JP | 2006294692 A | 10/2006 | |
| JP | 2007149731 A | 6/2007 | |
| JP | 2007158174 A | 6/2007 | |
| JP | 2008270346 A | 11/2008 | |

OTHER PUBLICATIONS

Japanese Official Action—2009-548919—Aug. 6, 2013.

* cited by examiner

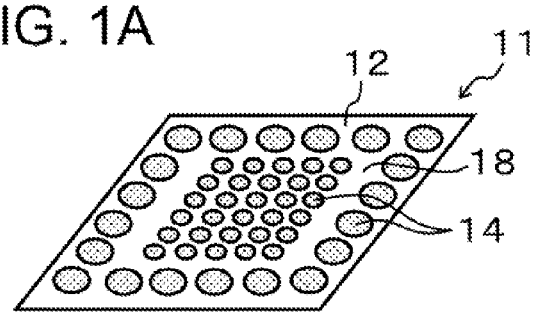
FIG. 1A
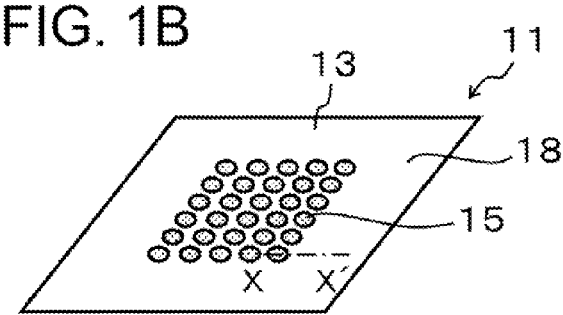
FIG. 1B
FIG. 1C  X–X'
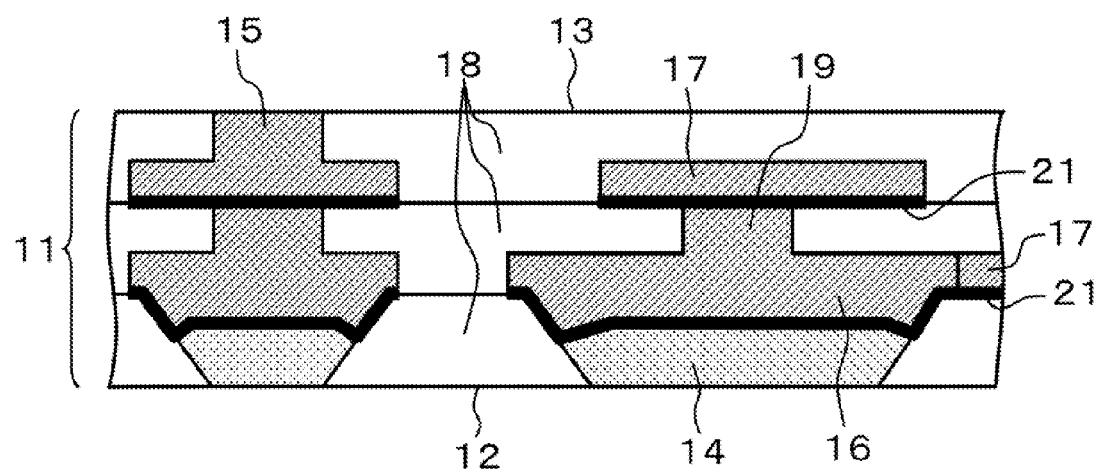

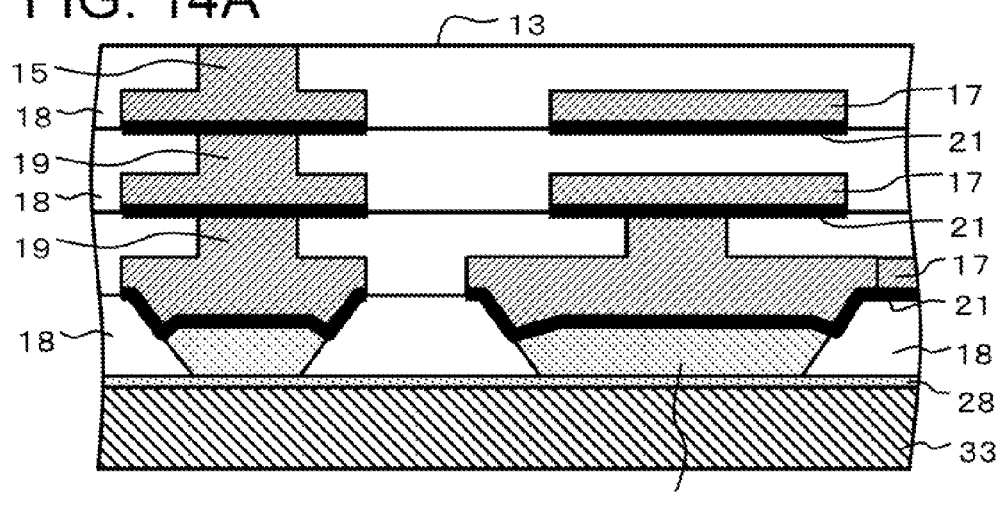
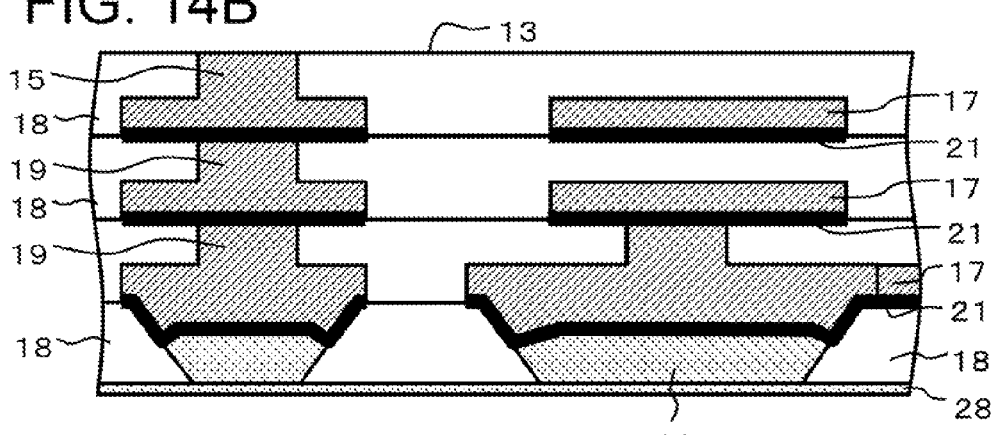
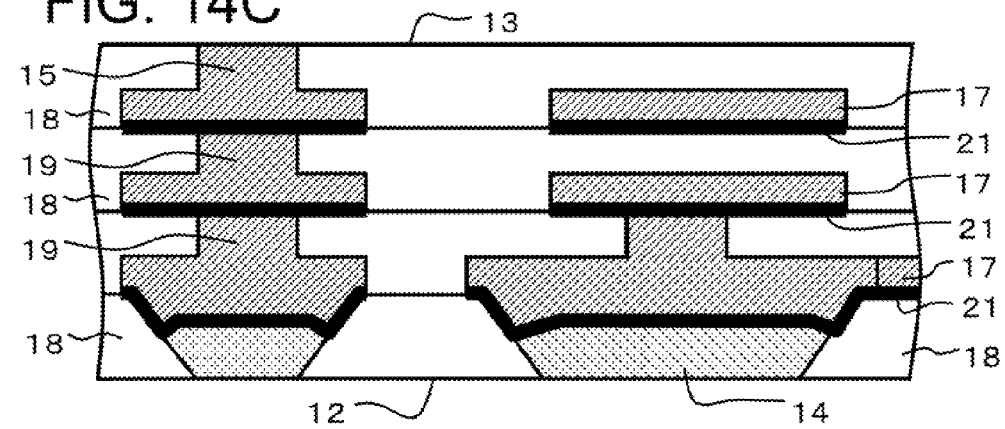

WIRING BOARD, SEMICONDUCTOR DEVICE, AND METHOD FOR MANUFACTURING WIRING BOARD AND SEMICONDUCTOR DEVICE

REFERENCE TO RELATED APPLICATION

This application is the National Phase of PCT/JP2009/050046, filed Jan. 6, 2009, which is based upon and claims the benefit of the priority of Japanese patent application No. 2008-002341, filed on Jan. 9, 2008, the disclosure of which is incorporated herein in its entirety by reference thereto.

TECHNICAL FIELD

The present invention relates to a wiring board including a semiconductor element, a semiconductor device including a semiconductor element on a wiring board, and a method for manufacturing the wiring board and the semiconductor device. In particular, it relates to a thin wiring board and semiconductor device having high-speed transmission characteristics and excellent mounting reliability and a method for manufacturing the wiring board and semiconductor device.

BACKGROUND

Devices or semiconductor elements are mounted on wiring boards. In recent years, these wiring boards are increasingly expected to be thinner and lighter and to have a higher density, in response to increased demands for smaller, thinner, and higher-density electronic devices and in response to an increase in the number of terminals of semiconductor elements along with advancement of the speed and function thereof.

Conventionally, a wiring board having through holes is common such as a build-up board. However, such board is thick and not desirable for high-speed signal transmission because of the through holes. Further, while a thin-type substrate such as a tape substrate is used as a wiring board, the manufacturing method thereof limits the number of wiring layers in the wiring board to one or two. In addition, since the tape base material has large elasticity, positional accuracy of the pattern is less than that of a build-up board. Thus, recent demands for a higher density cannot be met.

In response to these problems regarding wiring boards, there are proposed coreless substrates having no through holes. These substrates are formed by forming a wiring structure or the like on a prepared supporting substrate and removing or separating the supporting substrate. For example, Patent Document 1 discloses a technique of obtaining a wiring member including build-up wiring layers, as a coreless substrate. According to this document, an underlying layer and a metal foil are arranged on a prepreg that is used as a supporting substrate, and build-up wiring layers are formed on the metal foil. Subsequently, the circumferential part of the underlying layer is cut off to separate the metal foil. Patent Document 2 discloses a technique of obtaining a semiconductor device having circuit elements on a coreless substrate. According to this document, a multilayer wiring structure is formed on a metal foil used as a supporting substrate, and after circuit elements are mounted on the multilayer wiring structure, the metal foil is removed by etching. Patent Document 3 discloses a technique of obtaining a semiconductor device, by forming a first wiring layer on a supporting substrate, mounting a semiconductor element on a surface of the first wiring layer, removing the supporting substrate, and forming a second wiring layer on the surface opposite to the above surface of the first wiring layer.

While it is often the case that stress is caused by a difference in the thermal expansion coefficient between a wiring board and a semiconductor element mounted thereon, countermeasures against such stress are demanded. For example, Patent Document 4 discloses a construction that relaxes stress caused between a semiconductor element and a multilayered wiring board by a metal column arranged between terminals.

Patent Document 1:
JP Patent Kokai Publication No. JP2007-158174A
Patent Document 2:
JP Patent Kokai Publication No. JP2004-200668A
Patent Document 3:
JP Patent Kokai Publication No. JP2006-294692A
Patent Document 4:
JP Patent Kokai Publication No. JP2001-196496A

SUMMARY

The entire disclosures of Patent Documents 1 to 4 are incorporated herein by reference thereto. Analysis will be hereinafter made based on the present invention.

However, conventional wiring boards have the following problems.

According to Patent Document 1, vias are formed on external connection pads. If stress is generated when semiconductor elements are mounted on the wiring board or when the wiring board is mounted on a system board such as a motherboard, such stress is concentrated at a connecting interface between each external connection pad and a via thereon. Such a connecting interface with a via involves lower adhesion and thus fractures more easily, compared with portions formed as individual elements such as electrodes, wirings, and vias. Based on the structure disclosed in Patent Document 1, depending on the thickness of each of the wiring layers or the insulating layers or the pattern shape of each of the wiring layers having a higher rigidity than that of the insulating layers, the wiring layers or the insulating layers deform or shift differently. As a result, stress is concentrated at portions connected to vias, particularly, at each connecting interface between a via and a wiring on the external connection surface side. Thus, based on the via construction disclosed in Patent Document 1, since connecting interfaces with vias are arranged at portions where stress is concentrated, when semiconductor elements are mounted on the wiring board or the wiring board is mounted on a motherboard or the like, the risk of fracture at the connecting interfaces is increased.

Further, according to Patent Document 2, each connecting interface between a wiring layer connected to an external terminal and a via connecting to an upper wiring layer is arranged on the external terminal side. As in Patent Document 1, when semiconductor elements are mounted on the wiring board or when the wiring board is mounted on a motherboard or the like, generated stress is concentrated at the connecting interfaces with the vias. Therefore, the risk of fracture at the connecting interfaces is increased.

In addition, according to Patent Document 4, in order to relax the stress generated when semiconductor elements are mounted, easily-deformed protruded metal columns are arranged. However, as in Patent Document 1, each connecting interface between a wiring and an electrode is arranged where stress is concentrated, the risk of fracture is increased.

It is a primary object of the present invention to provide a highly reliable wiring board that ensures connecting reliability at the vias thereof.

According to a first aspect of the present invention, there is provided a wiring board in which insulating layers and wiring layers are alternately laminated and the wiring layers are electrically connected to each other by via(s). The wiring board includes: first terminal(s) arranged in a first surface and embedded in a first insulating layer among the insulating layers; second terminals) arranged in a second surface opposite to the first surface and embedded in a second insulating layer among the insulating layers; and land(s) arranged in an intermediate insulating layer among the insulating layers and in contact with the first terminal(s). The via(s) electrically connect(s) the land(s) and the wiring layer(s) laminated alternately with the insulating layer(s). No connecting interface is formed at an end of each of the vias on the land side but a connecting interface is formed at an end of each of the vias on the wiring layer side.

According to a second aspect of the present invention, there is provided a semiconductor device including the wiring board, a semiconductor element being mounted on one side or both sides of the wiring board.

According to a third aspect of the present invention, there is provided a wiring board manufacturing method including: forming a first insulating layer having opening(s) on a support (termed as "a first step"); forming first terminal(s) in the opening(s) (termed as "a second step"); forming wiring layer and metal post(s) for via(s) on the first insulating layer and the first terminal(s) (termed as "a third step"); forming a second insulating layer on the first insulating layer, the wiring layer, and the metal post(s) and polishing a surface of the second insulating layer until the metal post(s) is (are) exposed (termed as "a fourth step"); alternately repeating the third and fourth steps on the second insulating layer to form multiple wiring layers (termed as "a fifth step"); and removing the support (termed as "a sixth step").

According to a fourth aspect of the present invention, there is provided a semiconductor device manufacturing method including: forming a first insulating layer having opening(s) on a support (termed as "a first step"); forming a first terminals) in the opening(s) (termed as "a second step"); forming a wiring layer and metal post(s) for via(s) on the first insulating layer and the first terminal(s) (termed as "a third step"); forming a second insulating layer on the first insulating layer, the wiring layer, and the metal post(s) and polishing a surface of the second insulating layer until the metal post(s) is (are) exposed (termed as "fourth step"); alternately repeating the third and fourth steps on the second insulating layer to form multiple wiring layers (termed as "a fifth step"); mounting a semiconductor element(s) (termed as "a sixth step"); and removing the support (termed as "a seventh step").

EFFECT OF THE INVENTION

When a thin wiring board is mounted on a semiconductor element or a motherboard, stress is generated. This stress often causes wiring disconnection at vias in the thin wiring board. However, according to the present invention, since each via does not have a connecting interface at the boarder with a wiring formed on the surface side where the stress is concentrated but has a connecting interface at the boarder with a wiring formed on the inner side of the board, such wiring disconnection caused in the thin wiring board can be effectively prevented. Thus, connection reliability at the vias can be ensured.

That is, inbetween the internal wiring layers, there are variations in the deformation and displacement amount of each layer between terminals connected with via(s) and wiring layer, and between a plurality of wiring layers; as well as there are differences in the deforming direction per each form and thickness of the wiring layer(s) and insulating layer(s); further there are differences in adhesion area between the wiring layer(s) and the insulating layer(s). Such variation can be particularly significant near the terminals. As a result, the stress, generated when the wiring board is mounted on a semiconductor element or a motherboard, is concentrated at the vias. In particular, the stress is concentrated at (each) border between a via(s), formed in an insulating layer surrounding three sides of a wiring layer, and the wiring layer surrounded by the insulating layer. This is caused by a greater deformation of an insulating layer because the insulating layer surface in contact with a wiring layer has lower adhesion, compared with adhesion of an insulating layer surface not in contact with a wiring layer and because the deformation of the insulating layer exerts large effect due to the influence of the thickness of an insulating layer.

According to the present invention, no bonded interface is formed at a border between a via and a wiring layer immediately below, the border where an insulating layer exhibits a greater deformation amount. In addition, the wiring board according to the present invention includes adhering metal layers each ensuring high adhesion at a bonded interface between a via and the wiring layer immediately above and between the wiring layer and the insulating layer immediately below. Namely, a bonded interface is formed at the boarder between a via and a wiring layer immediately above. In this way, concentration of stress at each connecting interface between a via and a wiring layer can be prevented effectively, and therefore, high connection reliability can be stably ensured. This meritorious effect can be obtained because an insulating layer is corrected by the wiring layer connected via the adhesion layer and the insulating layer is similarly deformed at the adhesion region including the bonded interface with a via. The wiring board described above has adhesion layers, and each of the adhesion layers is formed between a wiring layer and the insulating layer below on the first surface side. In this way, since the wiring layer has more restraining force on the insulating layer, the insulating layer formed adjacent to the wiring layer via the adhesion layer is affected by the wiring layer. By forming a connecting interface between a wiring layer and a via in such region where an insulating layer is affected by the wiring layer, concentration of stress can be reduced effectively. As a result, high connection reliability can be realized. This meritorious effect is particularly remarkable when the via diameter $\phi$ is 20 μm or less.

In addition, by embedding the first and second terminals in insulating layers, stress concentrated at the terminals can be effectively relaxed by the insulating layers. As a result, reliability at connecting portions can be improved. In addition, by forming the second terminals to protrude from the surface of the insulating layer including the second terminals, connection at a distance of 40 μm or less can be achieved more easily, and a gap for allowing injection of an underfill or the like can be ensured. Further, by forming the second terminals to be depressed from the surface of the insulating layer including the second terminals, positional accuracy at connecting portions can be improved, and the second terminals can function as dams for solder. In addition, the insulating layers in which the first and second terminals are embedded can be made of material different from that of the inner insulating layers. In this case, the material for the terminal-side insulating layers is mainly selected in view of relaxation of stress. On the other hand, the material having high mechanical strength is mainly selected for the inner insulating layers, so that generation of cracks is prevented in the insulating layers. Thus, a wiring board that ensures high reliability over a long period of time can be realized. Further, by forming a thin wiring board, semiconductor elements mounted on both sides of the wiring board can be connected at the shortest distance, whereby performance of the wiring board can be improved.

In addition, since a support is used to manufacture the wiring board, a thin wiring board can be stably manufactured. Even when a semiconductor element is mounted on such wiring board, high positional accuracy can be maintained. Thus, high-yield, low-cost, and high-performance semiconductor devices can be manufactured. Therefore, a highly reliable wiring board, a semiconductor device using the wiring board, and a method for manufacturing the wiring board and the semiconductor device can be provided.

BRIEF DESCRIPTION OF THE DRAWINGS

FIGS. 1A and 1B are schematic perspective views of first and second surfaces of a wiring board according to example 1 of the present invention, respectively, and FIG. 1C is a partial cross section of the wiring board.

FIGS. 14A to 14C are schematic sectional views of a fifth step of the wiring board manufacturing method according to example 6 of the present invention.

PREFERRED MODES FOR CARRYING OUT THE INVENTION

Figure 2A:
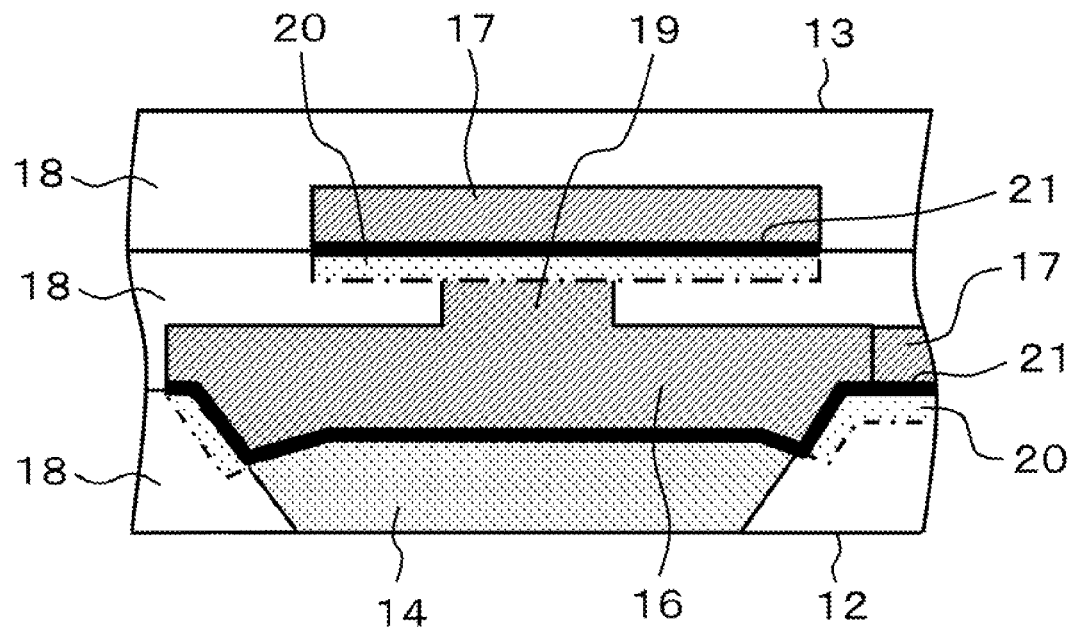
FIGS. 2A and 2B are schematic partial cross sections of the wiring board according to example 1 of the present invention in a normal state and when subjected to an external stress, respectively

In a wiring board (11 in FIG. 1) according to an exemplary embodiment of the present invention, insulating layers (18 in FIG. 1) and wiring layers (17 in FIG. 1) are alternately laminated and the wiring layers (17 in FIG. 1) are electrically connected to each other by vias (19 in FIG. 1). The wiring board (11 in FIG. 1) includes: first terminals (14 in FIG. 1) arranged in a first surface (12 in FIG. 1) and embedded in a first insulating layer (18 in FIG. 1) among the insulating layers (18 in FIG. 1); second terminals (15 in FIG. 1) arranged in a second surface (13 in FIG. 1) opposite to the first surface (12 in FIG. 1) and embedded in a second insulating layer (18 in FIG. 1) among the insulating layers (18 in FIG. 1); and land(s) (16 in FIG. 1) arranged in an intermediate insulating layer (18 in FIG. 1) among the insulating layers (18 in FIG. 1) and in contact with the first terminal(s) (14 in FIG. 1). The vias (19 in FIG. 1) electrically connect the land(s) (16 in FIG. 1) and the wiring layer(s) (17 in FIG. 1) laminated alternately with the insulating layers (18 in FIG. 1). No connecting interface is formed at an end of each of the vias (19 in FIG. 1) on the land (16 in FIG. 1) side but a connecting interface is formed at an end of each of the vias (19 in FIG. 1) on the wiring layer (17 in FIG. 1) side.

In addition, the following modes are possible.

It is preferable that the vias electrically connect the wiring layers and each of the vias has a bonded (joint) interface only at an end thereof on the second surface side.

It is preferable that the wiring board include adhesion layers, (each) formed on a surface of (each of) the wiring layer(s) on the first surface side and (each) causing the wiring layer and the insulating layer in contact with an adhesion layer to adhere to each other.

It is preferable that the wiring board include the adhesion layer(s), (each) formed on a surface of (each of) the land(s) on the first terminal side.

It is preferable that (each of) the first terminals has (have) a surface area exposed on the first surface and a cross-section area in contact with the land thereabove and the surface area be smaller than the cross-section area.

It is preferable that the second terminal(s) be formed directly on one of the wiring layer(s), each of the second terminal(s) have a surface area exposed on the second surface and a cross-section area in contact with the wiring layer thereon, and the surface area be larger than the cross-section area.

It is preferable that the insulating layer(s) be made of one kind of or a plurality of kinds of insulating material.

It is preferable that the insulating layer(s) be made of a plurality of kinds of insulating material and the insulating layers on the first and second surface sides be made of an identical insulating material It is preferable that the first terminal(s) and the second terminal(s), respectively be formed by laminating a plurality of metals.

It is preferable that each of the second terminal(s) be depressed from a surface of the insulating layer on the second surface side.

It is preferable that each of the second terminals protrude from a surface of the insulating layer on the second surface side.

Figure 8:
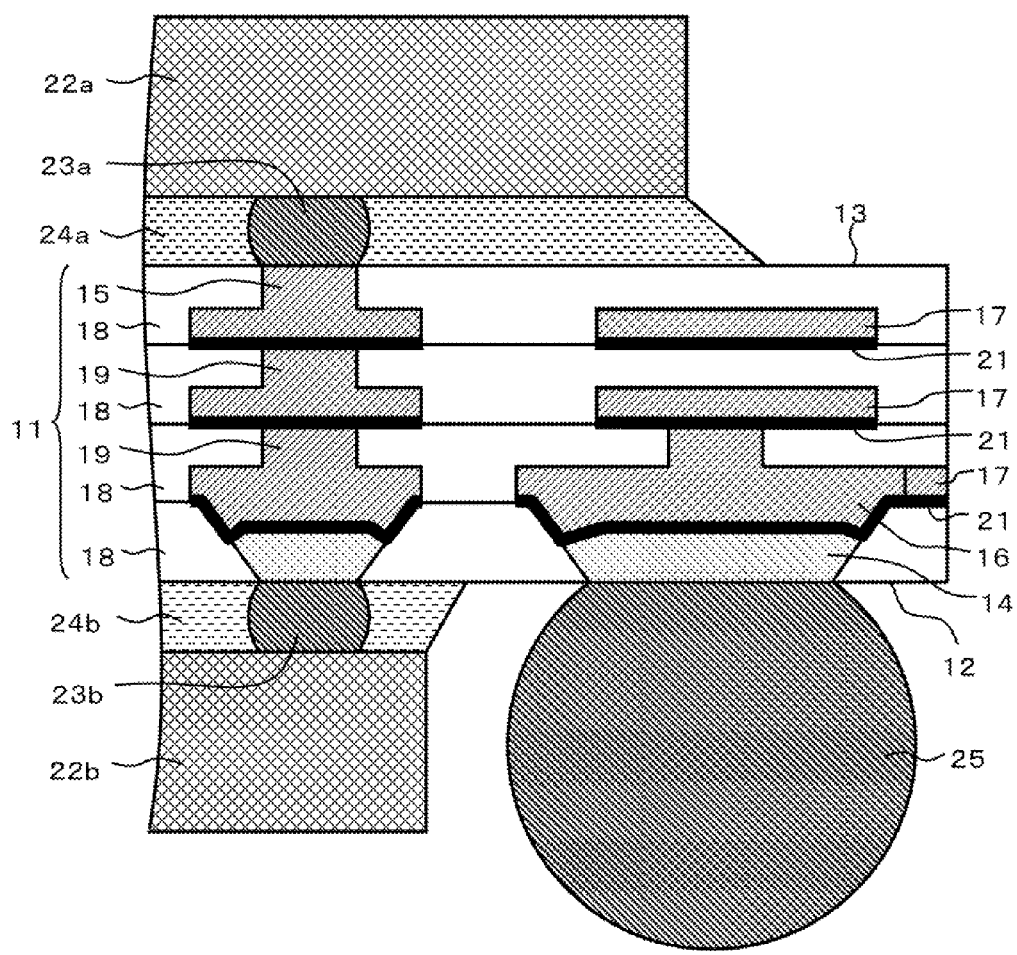
FIG. 8 is a schematic partial cross section of a semiconductor device according to example 4 of the present invention.

A semiconductor device according to an exemplary embodiment of the present invention includes a semiconductor element(s) (22a, 22b in FIG. 8) mounted on one side or both sides of a wiring board (II in FIG. 8)

In addition, the following modes are possible.

It is preferable that the semiconductor element(s) be mounted on the wiring board by a flip-chip connection and/or a wire bonding connection.

It is preferable that semiconductor elements be mounted on both sides of the wiring board by a flip-chip connection and opposite electrodes of the semiconductor elements mounted on the both sides be mainly connected by an accumulation of the vias in the wiring board.

A wiring board manufacturing method according to an exemplary embodiment of the present invention includes: a first step (FIG. 10C) of forming a first insulating layer (18 in FIG. 10) having opening(s) on a support (33 in FIG. 10); a second step (FIG. 10D) of forming first terminal(s) (14 in FIG. 10) in the opening(s); a third step (FIGS. 11A to 13A) of forming a wiring layer (16 and 17 in FIG. 13) and metal post(s) for via(s) (19 in FIG. 13) on the first insulating layer (18 in FIG. 13) and the first terminal(s) (14 in FIG. 13); a fourth step (FIGS. 13B and 13C) of forming a second insulating layer (18 in FIG. 13) on the first insulating layer (18 in FIG. 13), the wiring layer (16 and 17 in FIG. 13), and the metal post(s) (19 in FIG. 13) and polishing a surface of the second insulating layer (18 in FIG. 13) until the metal post(s) (19 in FIG. 13) is (are) exposed; a fifth step (FIG. 14A) of alternately repeating the third and fourth steps on the second insulating layer (18 in FIG. 13) to form multiple wiring layers; and a sixth step (FIG. 14B) of removing the support (33 in FIG. 14).

In addition, the following modes are possible.

It is preferable that, before the wiring layer and the metal posts are formed in the third step, a feed layer be formed on the first insulating layer and the first terminals, and thereafter, electrolytic plating be carried out with the feed layer to form the wiring layer and the metal post.

It is preferable that, before the first insulating layer is formed in the first step, a conductor layer be formed on the support, and thereafter, the first insulating layer be formed on the conductor layer, and that separation is performed at an interface between the support and the conductor layer in the sixth step.

It is preferable that the method include a seventh step of forming a third insulating layer as a topmost surface after the fifth step.

It is preferable that opening(s) be formed in the third insulating layer and second terminal(s) be formed in the opening(s) in the seventh step.

Figure 17A:
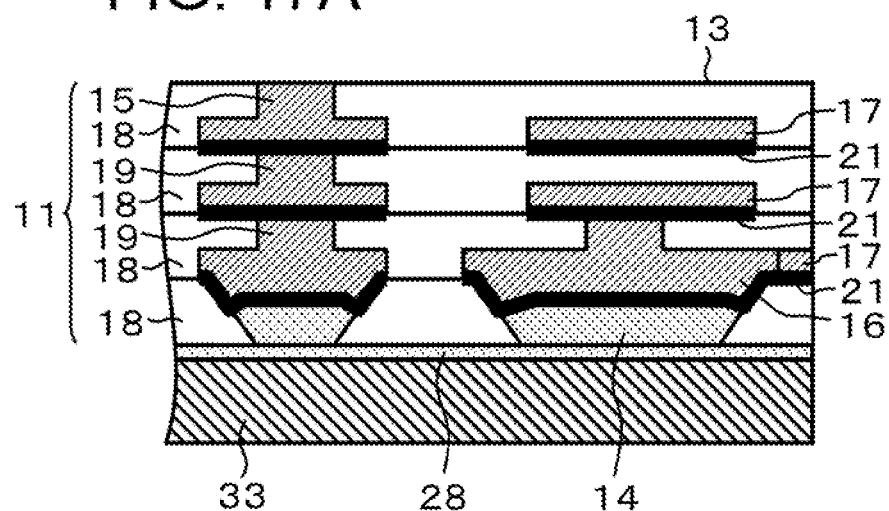
FIGS. 17A and 17B are schematic sectional views of a first step of a semiconductor device manufacturing method according to example 8 of the present invention.
Figure 17B:
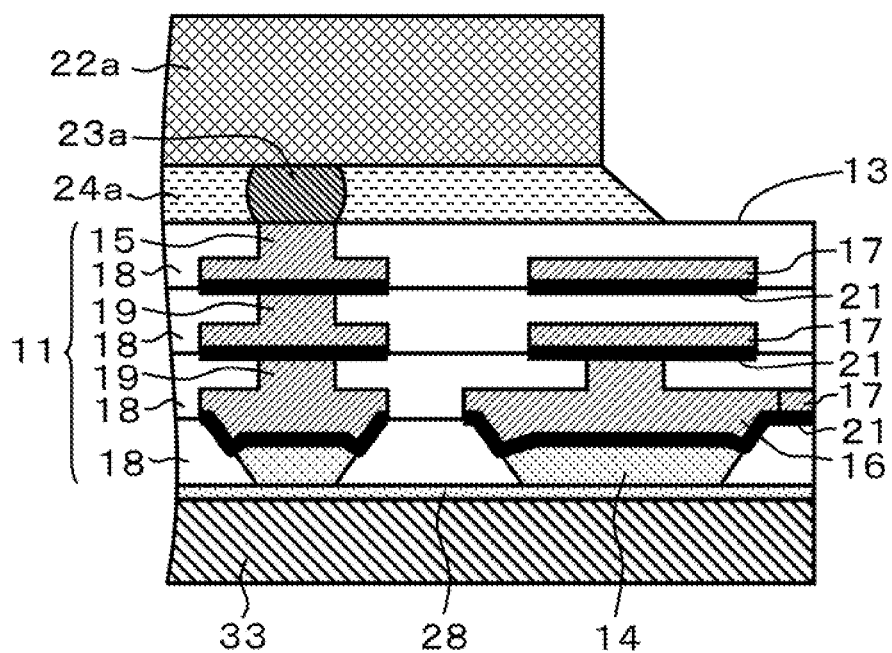
Figure 18A:
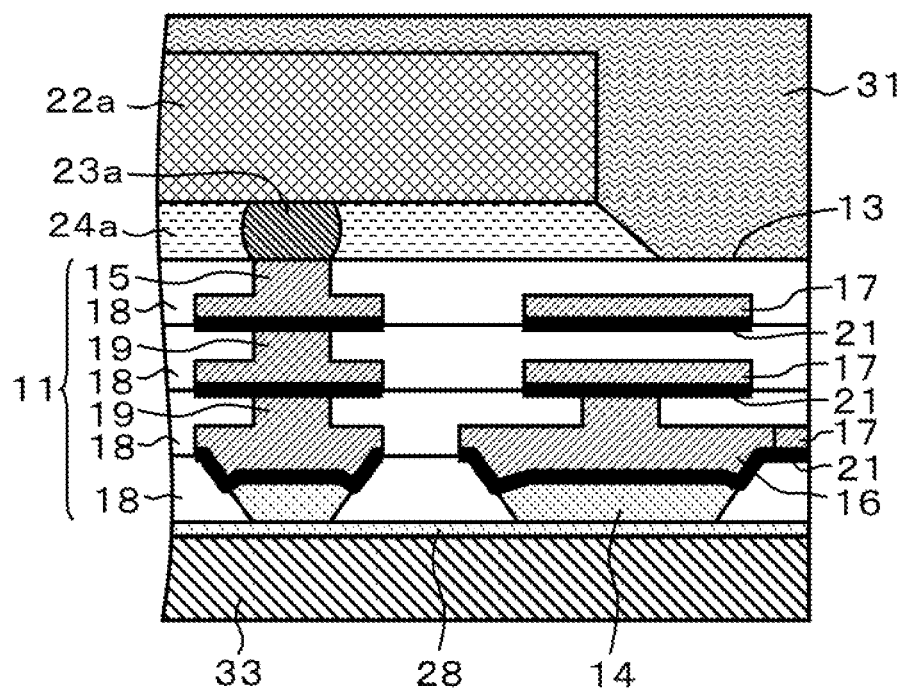
FIGS. 18A and 18B are schematic sectional views of a second step of the semiconductor device manufacturing method according to example 8 of the present invention.
Figure 18B:
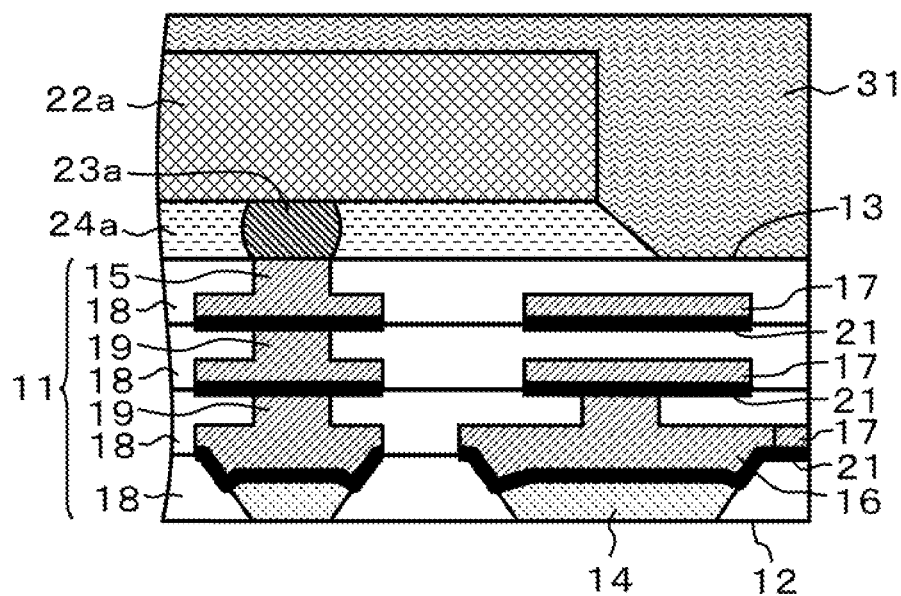

A semiconductor device manufacturing method according to an exemplary embodiment of the present invention includes: a first step (FIG. 10C) of forming a first insulating layer (18 in FIG. 10) having opening(s) on a support (33 in FIG. 10); a second step (FIG. 10D) of forming a first terminal(s) (14 in FIG. 10) in the opening(s); a third step (FIGS. 11A to 13A) of forming a wiring layer (16 and 17 in FIG. 13) and metal post(s) for via(s) (19 in FIG. 13) on the first insulating layer (18 in FIG. 13) and the first terminal(s) (14 in FIG. 13); a fourth step (FIGS. 13B and 13C) of forming a second insulating layer (18 in FIG. 13) on the first insulating layer (18 in FIG. 13), the wiring layer (16 and 17 in FIG. 13), and the metal post(s) (19 in FIG. 13) and polishing a surface of the second insulating layer (18 in FIG. 13) until the metal post(s) (19 in FIG. 13) are exposed; a fifth step (FIGS. 14A and 17A) of alternately repeating the third and fourth steps on the second insulating layer (18 in FIG. 13) to form multiple wiring layers; a sixth step of mounting a semiconductor element(s) (22a in FIG. 17); and a seventh step (FIG. 18B) of removing the support (33 in FIG. 18).

In addition, the following modes are possible.

It is preferable that the semiconductor device manufacturing method include, between the sixth step and the seventh step, an eighth step of forming a mold resin on a surface on which the semiconductor element(s) is (are) mounted.

It is preferable that, before the first insulating layer is formed in the first step, a conductor layer is formed on the support, and thereafter, the first insulating layer is formed on the conductor layer, and that separation is performed at an interface between the support and the conductor layer in the seventh step.

It is preferable that the semiconductor device manufacturing method include a ninth step of mounting semiconductor element(s) on the exposed first terminal(s) after the seventh step.

It is preferable that, in the sixth and ninth steps, the semiconductor element(s) be mounted by a flip-chip connection and/or a wire bonding connection.

It is preferable that the semiconductor device manufacturing method include a tenth step of mounting a solder ball(s) as an external terminal(s) after the seventh step.

Example 1

Figure 2B:
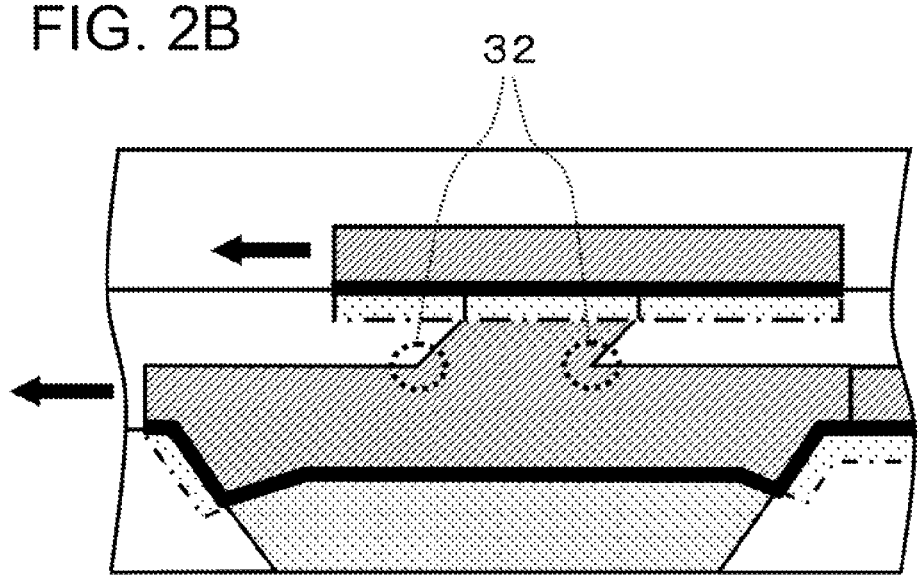
Figure 3:
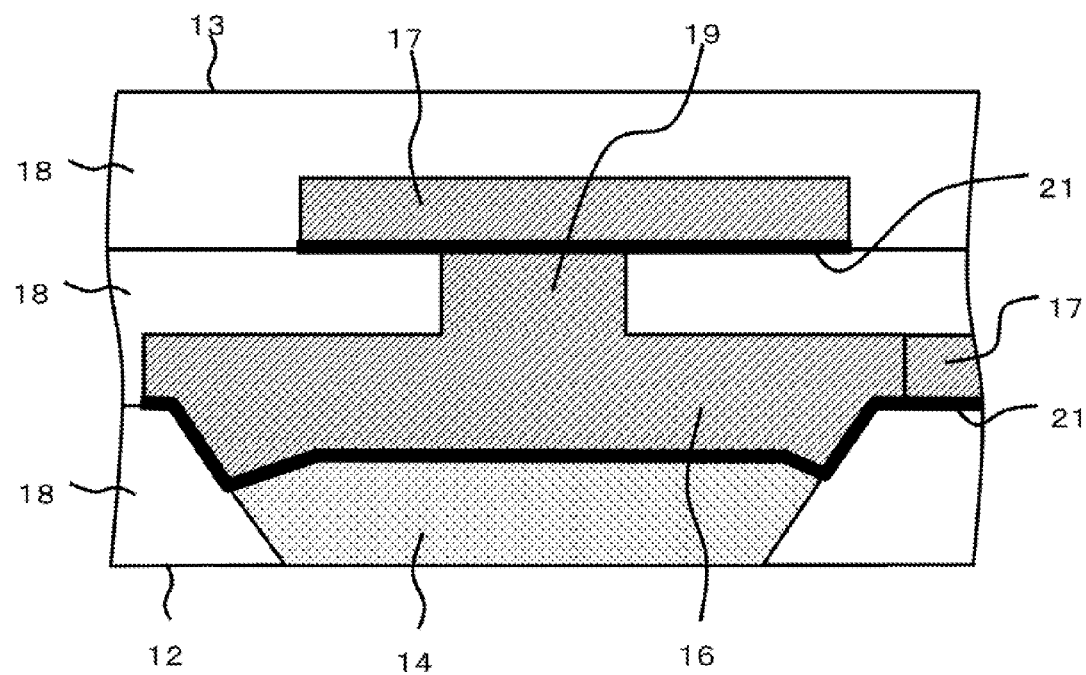
FIG. 3 is a schematic enlarged partial cross section of the wiring board according to example 1 of the present invention.

A wiring board according to example 1 of the present invention will be described with the drawings. FIG. 1A is a schematic perspective view of a first surface of the wiring board according to example 1 of the present invention. FIG. 1B is a schematic perspective view of a second surface of the wiring board, and FIG. 1C is a schematic partial cross section of the wiring board. FIGS. 2A and 2B are schematic partial cross sections of the wiring board according to example 1 of the present invention in a normal state and when subjected to an external stress, respectively. FIG. 3 is a schematic enlarged partial cross section of the wiring board according to example 1 of the present invention.

In FIG. 1, a wiring board 11 is a multilayered wiring board in which insulating layers 18 and wiring layers 17 (lands 16 where first terminals 14 are connected) are alternately laminated and vias 19 connect the wiring layers 17. The wiring board 11 has a first surface 12 and a second surface 13. The first surface 12 is formed by an insulating layer 18, and the first terminals 14 are embedded in prepared holes formed in this insulating layer 18. The second surface 13 is formed by another insulating layer 18, and the second terminal(s) 15 is (are) embedded in prepared hole(s) formed in this insulating layer 18. The surface of each of the first terminals 14 on the second surface 13 side is connected to a land 16 via an adhesion layer 21. Each of the lands 16 is directly connected to a wiring layer 17 in the same layer and is also connected to an upper wiring layer 17 via a via 19. Namely, since the end portion of each of the vias 19 on the first surface 12 side is directly connected to a land 16 without an adhesion layer 21, a connecting interface is not formed between each via 19 and the land 16 immediately below. Further, since the end portion of each of the vias 19 on the second surface 13 side is connected to a wiring layer 17 above via (another) adhesion layer 21, a connecting interface is formed between each via 19 and the wiring layer 17 immediately above. In addition, since the end portion of each of the second terminals 15 on the first surface 12 side is directly (solid) connected to a wiring layer 17 without an adhesion layer 21, a connecting interface is not formed between each of the second terminals 15 and the wiring layer 17 immediately below. Not only the surface connected to the via 19 below, the whole surface of each of the wiring layer 17 on the first surface 12 side is connected to the adhesion layer 21 disposed immediately below. Thus, each of the wiring layers 17 is firmly attached to the insulating layer 18 below via the adhesion layer 21. Further, not only the surface connected to the first terminal 14 below, the whole surface of each of the lands 16 on the first surface 12 side is connected to the adhesion layer 21 immediately below. Thus, each of the lands 16 is firmly attached to the insulating layer 18 below via the adhesion layer 21.

Each of the first terminals 14 is embedded in a prepared hole formed in the insulating layer 18 on the first surface 12 and is exposed on the first surface 12. The surface of each of the first terminals 14 on the second surface 13 side is connected to a land 16 via an adhesion layer 21. The first terminal(s) 14 can be formed by laminating a plurality of metal layers such as copper, nickel, palladium, platinum, gold, silver, tin, and aluminum. In view of wettability of a solder ball (not illustrated) or connectivity to a bonding wire formed on the surface of the first terminal 14, it is preferable that the surface of each of the first terminals 14 be made of at least one kind of metal or an alloy selected from the group consisting of gold, silver, copper, tin, and solder material. While not illustrated, for example, the first terminal(s) 14 can be formed by laminating nickel (13 µm) and gold (0.5 µm) in this order from the adhesion layer 21 side (namely, the surface is made of gold). In the example illustrated in FIG. 1A, the first terminals 14 have different sizes. However, the present invention is not limited to such example. The size of each of the first terminals 14 may be arbitrarily set, depending on the sizes or positions of the terminals of mounted semiconductor elements, electronic devices, boards, or the like.

Each of the second terminals 15 is embedded in a prepared hole formed in the insulating layer 18 on the second surface 13 and is exposed on the second surface 13. The surface of each of the second terminals 15 on the first surface 12 side is directly connected to a wiring layer 17. The second terminals 15 can be formed by laminating a plurality of layers such as copper, nickel, palladium, platinum, gold, silver, tin, and aluminum. In view of wettability of a solder ball (not illustrated) or connectivity to a bonding wire formed on the surface of the second terminal 15, it is preferable that the surface of each of the second terminals 15 be made of at least one kind of metal or an alloy selected from the group consisting of gold, silver, copper, tin, and solder material. While not illustrated, for example, the second terminals 15 can be formed by laminating copper (5 µm), nickel (3 µm) and gold (0.5 µm) in this order from the wiring layer 17 side (namely, the surface is made of gold). In the example illustrated in FIG. 1B, the second terminals 15 are arranged in the central part of the wiring board 11. However, the present invention is not limited to such example. The arrangement of the second terminals 15 may be arbitrarily set, depending on the sizes or positions of the terminals of mounted semiconductor elements, electronic devices, boards, or the like.

While the lands 16 and the wiring layer(s) 17 can be made mainly by any one of copper, gold, nickel, aluminum, silver, and palladium or a plurality of these materials, copper is most preferable in view of the resistance and cost. If nickel is used, interfacial reaction with other materials such as the insulating materials can be prevented, and by utilizing characteristics as a magnetic material, the lands 16 and the wiring layers 17 can be used as inductors or resistance wirings. Each of the lands 16 and the wiring layers 17 can be made by copper (5 µm), for example. Each of the lands 16 is formed immediately above a first terminal 14 via an adhesion layer 21 and is larger than the first terminal 14. Each of the lands 16 covers the insulating layer 18 around the circumference of the first terminal 14 below the land 16 via the adhesion layer 21. As long as each of the lands 16 is connected to a wiring layer 17, the lands 16 and the wiring layer 17 are not necessarily manufactured in the same step. However, to arrange the lands 16 and the wiring layer 17 in the same layer or to simplify the step, the lands 16 and the wiring layer 17 may be formed in the same step.

The lands 16 and the wiring layers 17 can be formed by a subtractive process, a semi-additive process, a fully-additive process, or the like. The subtractive process is a method for obtaining a desired pattern, and based on this process, first, a resist of a desired pattern is formed on a copper foil arranged on a board. A desired pattern can be obtained by etching unnecessary copper foil and peeling the resist. The semi-additive process is also a method for obtaining a desired wiring pattern, and based on this process, first, a feed layer (corresponding to an adhesion layer 21) is formed by an electroless plating method, a sputtering method, a chemical vapor deposition (CVD) method, or the like. Next, a resist having openings of a desired pattern is formed, and metal is deposited in the openings of the resist by an electrolytic plating method. Next, by etching the feed layer (corresponding to the adhesion layer 21) that is exposed after the resist is removed, a desired wiring pattern can be obtained. A fully-additive process is a method for obtaining a desired wiring pattern by adsorbing an electroless plating catalyst on a board, forming a resist pattern, activating the catalyst while leaving the resist film as an insulating film, and depositing metal in the openings of the insulating film by an electroless plating method. Alternatively, the lands 16 and the wiring layers 17 may be made by another method in which depressed portions used for a wiring pattern are arranged in the insulating layer (not illustrated) where the lands 16 and the wiring layers 17 are arranged, a feed layer is next formed through an electroless plating method, a sputtering method, a chemical vapor deposition (CVD) method, or the like, the depressed portions are filled through an electroless plating method or an electrolytic plating method, and the surface is adjusted by polishing.

The insulating layers 18 can be made of photosensitive or nonphotosensitive organic material, for example. For example, epoxy resin, epoxy acrylate resin, urethane acrylate resin, polyester resin, phenol resin, polyimide resin, benzocyclobutene (BCB), polybenzoxazole (PBO), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB, PBO, polynorbornene resin, or the like may be used as the organic material. Particularly, since polyimide resin, PBO, or material using woven fabric or nonwoven fabric are excellent in mechanical characteristics such as the film strength, tensile elastic modulus, and break elongation, high reliability can be achieved. For example, the insulating layers 18 can be made of polyimide (each layer with a thickness of 10 µm).

Each of the vias 19 has a connecting interface on the end portion thereof on the second surface 13 side. This structure can prevent interfacial fracture more effectively, compared with the structure where each of the vias 19 has a connecting interface on the end portion thereof on the first surface 12 side. Assuming that a semiconductor element (not illustrated) is mounted on the wiring board 11 including organic resin and this semiconductor device (not illustrated) is mounted on a board (not illustrated), if stress is applied to the wiring board 11, the insulating layers 18 are deformed more significantly than the wiring layers 17, which have a higher elastic modulus and rigidity than the insulating layers 18. As a result, the stress is concentrated at the vias 19 connecting the wiring layers. As illustrated in FIGS. 2A and 2B, when a semiconductor device (not illustrated) is mounted on a board (not illustrated), this concentration of the stress is changed from a normal state as illustrated in FIG. 2A to a state as illustrated in FIG. 2B in which the board is subjected to external stress indicated by the arrows. Under such external stress, the patterns of the first terminals 14 and the wiring layers 17 vary the direction or amount of the deformation generated in each layer. Further, since the insulating layers 19 and the first terminals 14 or the wiring layers 17 (lands 16) are firmly bonded to each other via the adhesion layers 21, correction regions 20 illustrated in FIGS. 2A and 2B are generated in the insulating layers 18. In these correction regions 20, deformation of the insulating layers 18 is corrected by the first terminals 14 or the wiring layers 17 (lands 16), and the stress is adjusted by the pattern of each of the first terminals 14 or the wiring layers 17 (lands 16). Thus, the stress is not concentrated at the bonded interfaces of the vias 19. In contrast, at the boundaries between each via 19 and a land 16 immediately below and between each via 19 and a wiring layer 17 immediately below on the first surface 12 side, that is, at portions where the wiring layers 17 have less restraining force on the insulating layers 18, stress concentration region 32 are generated because of the deformation of the insulating layers 18 and the rigidity of the lands 16 or the wiring layers 17. As described above, since a bonded interface is formed between each via 19 and a wiring layer 17 above on the adhesion layer 21 side, fracture of the bonded interface at each via 19 can be prevented effectively. Particularly, when the vias 19 have a diameter φ of 20 μm or less, connection reliability can be improved. In example 1, no adhesion layer 21 is formed at the boundary between each via 19 and a land 16 or a wiring layer 17 immediately below on the first surface 12 side. Namely, the vias 19 and the lands 16 as well as the vias 19 and the wiring layers 17 are formed integrally. It is preferable that no boundary that fractures at the stress concentration regions 32 be formed. In addition, it is preferable that no grain boundary be horizontally formed between each via 19 and a land 16 immediately below and between each via 19 and a wiring layer 17 immediately below in the vias 19 at the stress concentration region 32. In order to form the bonded interfaces of the vias 19 on the second terminal 13 side, metal post(s) is (are) formed in advance by a plating method at the position(s) corresponding to the via(s) 19. Alternatively, a whole-surface-plating is first carried out, and metal posts and wirings are next formed by etching. Subsequently, after an insulating film of organic material is formed, by polishing the insulating film to expose the metal posts, the vias 19 can be formed. According to a plating method, in a pretreatment, oxide is removed from the metal surface of the underlying layer, and when the plating metal is initially deposited, an epitaxial grown method which is carried out based on the metal grain boundary of the underlying layer is used. Thus, even if formed in separate steps, the vias 19 and the lands 16 as well as the vias 19 and the wiring layers 17 can be integrally formed. Therefore, no grain boundaries as described above are formed horizontally.

The adhesion layers 21 are made of a material having adhesion to the material of the insulating layers 18. For example, the adhesion layers 21 may be made of titanium, tungsten, nickel, tantalum, vanadium, chromium, molybdenum, copper, aluminum, or an alloy of these materials. Particularly, titanium, tungsten, tantalum, chromium, molybdenum, or an alloy of these materials is more preferable, and titanium, tungsten, or an alloy of these materials is most preferable. The adhesion layers 21 may be formed on the insulating layers 18 having a rough surface (surface having minute concavity and convexity). In this case, even when the adhesion layers 21 are made of copper or aluminum, good adhesion can be obtained easily. Further, in order to improve adhesion, it is preferable that the adhesion layers 21 be formed by a sputtering method. By forming an adhesion layer 21 between each via 19 and a wiring layer 17 immediately above and by forming the junction area of the wiring layer 17 and the adhesion layer 21 to be larger than the junction area of the via 19 and the wiring layer 17, the insulating layers 18, including the circumference of each of the vias 19, are corrected by the wiring layers 17. Thus, since the wiring layers 17, the vias 19, and the insulating layers 18 formed around the adhesion layers 21 are shifted in approximately the same direction, the bonded interface between each via 19 and the wiring layer 17 immediately above is deformed less. Therefore, even when each of the vias 19 has a minute diameter, fracture at the bonded interface can be prevented effectively.

In FIG. 3, each of the first terminals 14 is half as thick as the insulating layer 18 including the first terminals 14, and the adhesion layer 21 covers the first terminals 14 and the insulating layers 18. Each of the first terminals 14 is connected to a land 16 above via the adhesion layer 21. By forming each of the first terminals 14 to be half as thick as the insulating layer 18 and forming the adhesion layer 21 to cover the wall of the insulating layer 18, the insulating layer 18 and the first terminal 14 can be bonded firmly to each other, while maintaining the function of the connecting surface of the first terminal 14. Further, when solder material is used for a first terminal 14, the solder material could possibly flow into a gap between the first terminal 14 and the insulating layer 18 adjacent thereto. However, each first terminal 14 is connected to the land 16 thereabove via an adhesion layer 21, such flow of solder material can be stopped by the adhesion layer 21. Thus, embrittlement, which may be caused when the land 16 (metal layer) and the solder material form an alloy, can be prevented effectively.

While each of the first terminals 14 has an area connected to a land 16 thereabove via an adhesion layer 21 and a surface area exposed on the first surface 12, it is desirable that the area be larger than the surface area. In this way, the adhesion between the first terminal 14 and the land 16 can be increased effectively.

Figure 4:
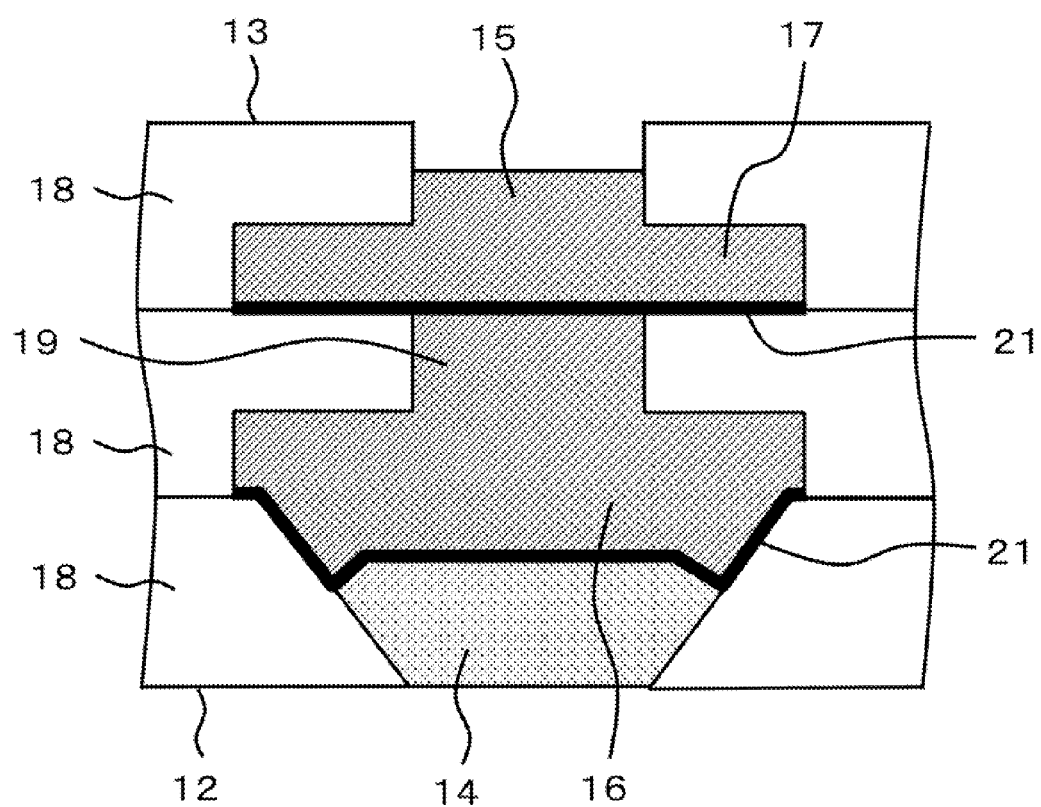
FIG. 4 is a schematic partial cross section of a first variation of the wiring board according to example 1 of the present invention.
Figure 5:
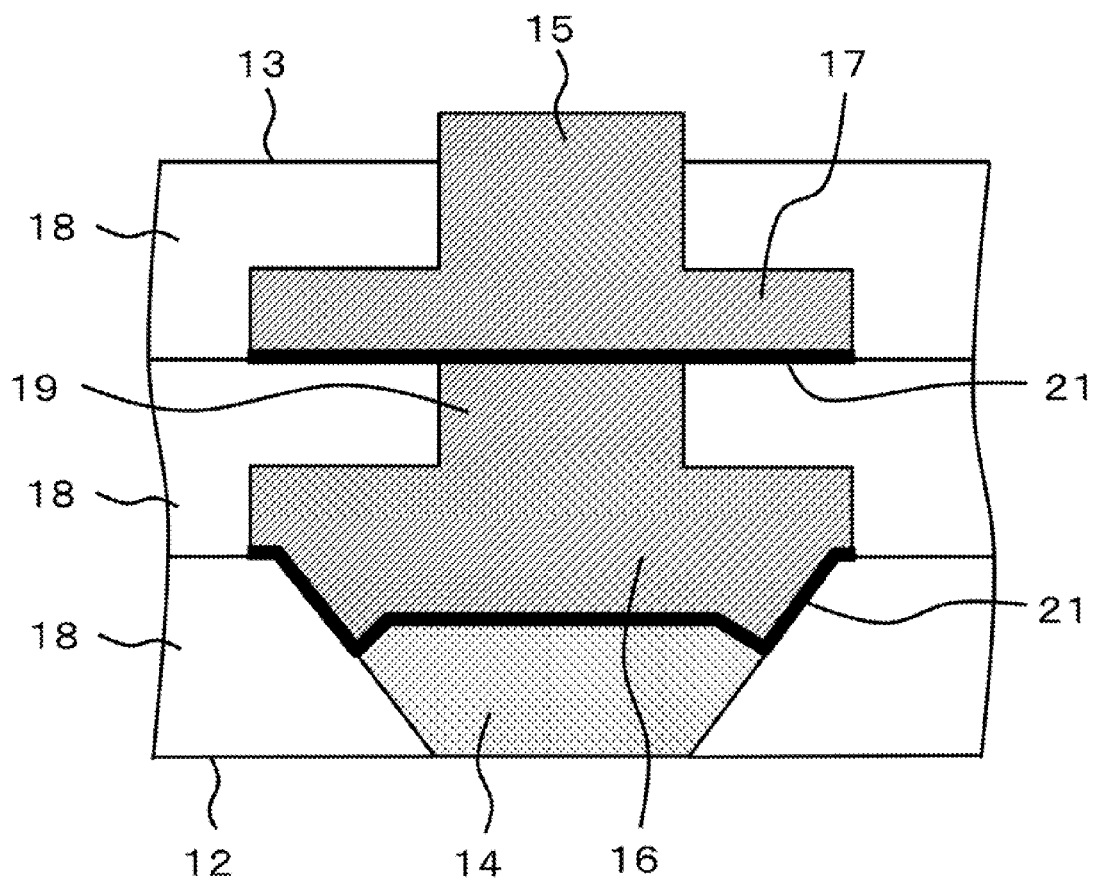
FIG. 5 is a schematic partial cross section of a second variation of the wiring board according to example 1 of the present invention.

In FIG. 1C, the surface of each first terminal 14 is in approximately the same plane as a surface of the insulating layer 18 including the first terminal 14, and the surface of each second terminal 15 is in approximately the same plane as a surface of the insulating layer 18 including the second terminal 15. However, the first terminals 14 and the second terminals 15 may be depressed (see FIG. 4) or protrude (see FIG. 5) from the first surface 12 and the second surface 13, respectively. Particularly, when terminals are arranged on the first surface 12 side to mount the wiring board 11 on a board (not illustrated), since the second terminals 15 need to be connected to a semiconductor element (not illustrated) mounted on the second surface 13 side at a short distance of 50 μm or less, it is preferable that the second terminals 15 be formed as illustrated in FIG. 4 or 5. If the first surface 12 or the second surface 13 is approximately flat as illustrated in FIG. 1C, when a semiconductor element (not illustrated) is mounted or when a semiconductor device (not illustrated) is formed and mounted on a board (not illustrated), in a step for applying resin such as underfill or mold, generation of voids, which may be caused due to the level difference of the terminals, can be reduced effectively. If the terminals are formed to be depressed (see FIG. 4) or protrude (see FIG. 5), the terminals can be used as contact-type switch terminals.

In addition to the meritorious effect obtained by the flat surface illustrated in FIG. 1, the structure as illustrated in FIG. 4 can provide additional advantages. For example, since the second terminals 15 are depressed from the second surface 13, short circuits, which may be caused by a flow of solder material used for connection with semiconductor elements (not illustrated), can be prevented effectively. In order to obtain this meritorious effect, it is desirable that the terminals be depressed (depth) by 0.3 µm or more.

Based on the structure illustrated in FIG. 5, even when the wiring board is connected to a semiconductor element (not illustrated) at a short distance, since the distance with the semiconductor element (not illustrated) can be ensured, underfill or the like can be applied easily. In addition, better connection reliability can be ensured since deformation of the insulating layer 18 at a location between the connect terminals can be prevented effectively. In order to obtain this meritorious effect, it is desirable that the terminals protrude by 0.5 µm or more.

A method for manufacturing the wiring board according to example 1 will be described in example 6 (FIGS. 10 to 14).

According to example 1, a connecting interface between each via 19 and a wiring layer 17 immediately above is formed where an adhesion layer 21 is formed. Thus, the insulating layers 18 are corrected by the wiring layers 17, and concentration of stress at the connecting interface can be reduced effectively. Even when the vias 19 have a minute diameter, a wiring board having high connection reliability can be realized.

Example 2

Figure 6:
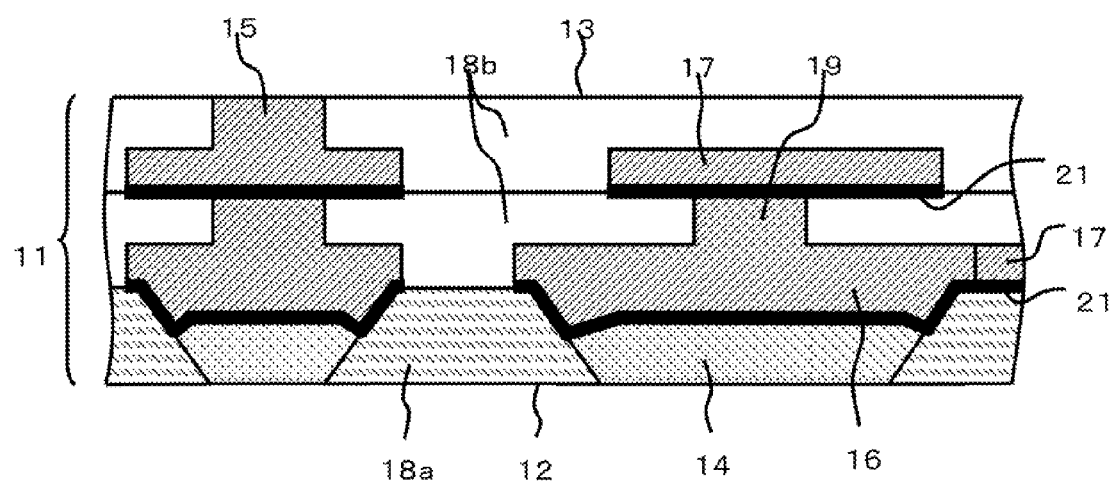
FIG. 6 is a schematic partial cross section of a wiring board according to example 2 of the present invention.

A wiring board according to example 2 of the present invention will be described with reference to the drawings. FIG. 6 is a schematic partial cross section of the wiring board according to example 2 of the present invention.

In the wiring board according to example 2, an insulating layer 18a and insulating layers 18b are used. Specifically, unlike the wiring board according to example 1 (see FIG. 1), a plurality of kinds of material is used for the insulating layers. The wiring board according to example 2 is the same as that according to example 1 in other portions. In FIG. 6, the first terminals 14 and the second terminals 15 are formed in the same way as those of example 1 (see FIG. 1), the terminals 14 and 15 may be formed to be depressed (see FIG. 4) or to protrude (see FIG. 5) from the first surface 12 and the second surface 13, respectively.

The insulating layer 18a is formed on the first surface 12 side, and the insulating layers 18b include an insulating layer formed on the second surface 13 side and insulating layers formed as intermediate layers. The insulating layers 18a and 18b are made of, for example, photosensitive or nonphotosensitive organic material. For example, epoxy resin, epoxy acrylate resin, urethane acrylate resin, polyester resin, phenol resin, polyimide resin, benzocyclobutene (BCB), polybenzoxazole (PBO), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB, PBO, polynorbornene resin, or the like may be used as the organic material. Particularly, since polyimide resin, PBO, or material using woven fabric or nonwoven fabric are excellent in mechanical characteristics such as the film strength, tensile elastic modulus, and break elongation, high reliability can be achieved.

When the first terminals 14 are used to function as connect terminals to mount the wiring board 11 on a board (not illustrated), it is preferable that the insulating layer 18a be made of a material having a high mechanical strength, such as polyimide resin, PBO, or a material using woven fabric or nonwoven fabric. Further, it is preferable that the insulating layers 18b be made of a material having excellent electric characteristics and low [dielectric] loss such as BCB resin, epoxy resin, or epoxy acrylate resin, while these materials have a less mechanical strength than polyimide resin, PBO, and material using woven fabric or nonwoven fabric. By combining the insulating layers 18a and 18b as described above, generation of cracks after the wiring board 11 is mounted on a board (not illustrated) can be prevented effectively, and a wiring board having both a high mechanical strength and excellent electric characteristics can be realized. In example 2, the insulating layer 18a is made of photosensitive polyimide with a thickness of 10 µm, and the insulating layers 18b are made of nonphotosensitive polyimide having a lower dielectric constant than that of the insulating layer 18a.

Since each of first terminals 14 has an area connected to a land 16 thereabove via an adhesion layer 21 and a surface area exposed on the first surface 12, it is desirable that the area be larger than the surface area. Thus, it is effective to make the insulating layers 18a of photosensitive resin.

According to example 2, a wiring board having both a high mechanical strength and excellent electric characteristics can be realized, in addition to the same meritorious effects obtained by the wiring board according to example 1.

Example 3

Figure 7:
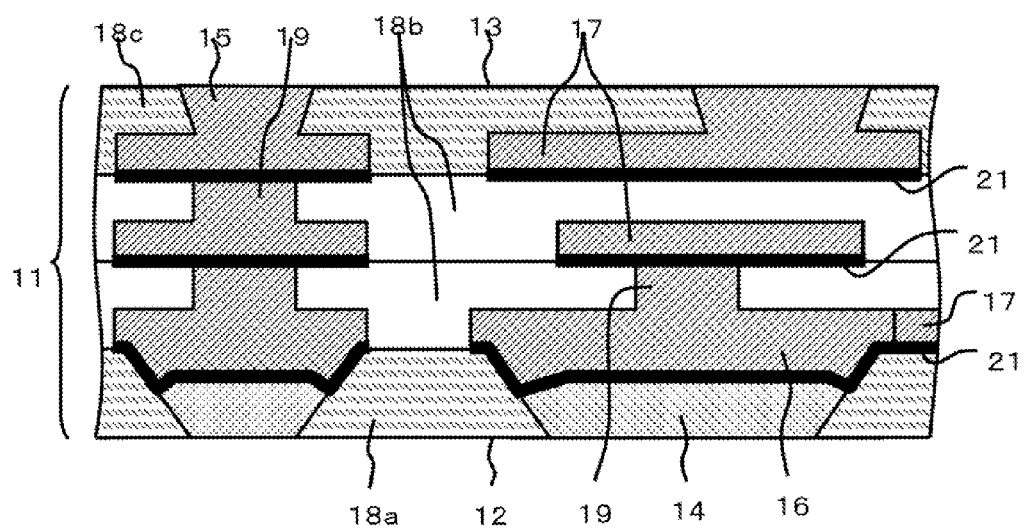
FIG. 7 is a schematic partial cross section of a wiring board according to example 3 of the present invention.

A wiring board according to example 3 of the present invention will be described with reference to the drawings. FIG. 7 is a schematic partial cross section of the wiring board according to example 3 of the present invention.

In the wiring board according to example 3, an insulating layer 18a, insulating layers 18b, and an insulating layer 18c are used as insulating layers 18. Specifically, unlike the wiring boards according to examples 1 and 2 (see FIGS. 1 and 6), a plurality of kinds of material is used for the insulating layers. The wiring board according to example 3 is the same as that according to example 1 (see FIG. 1) in other portions. In FIG. 5 [sic. FIG. 7], the first terminals 14 and the second terminals 15 are formed in the same way as those of example 1 (see FIG. 1), the terminals 14 and 15 may be formed to be depressed (see FIG. 4) or to protrude (see FIG. 5) from the first surface 12 and the second surface 13, respectively.

The insulating layer 18a is formed on the first surface 12 side, and the insulating layers 18b are formed as intermediate layers. The insulating layer 18c is formed on the second surface 13 side. The insulating layers 18a, 18b, and 18c are made of, for example, photosensitive or nonphotosensitive organic material. For example, epoxy resin, epoxy acrylate resin, urethane acrylate resin, polyester resin, phenol resin, polyimide resin, benzocyclobutene (BCB), polybenzoxazole (PBO), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB, PBO, polynorbornene resin, or the like may be used as the organic material. Particularly, since polyimide resin, PBO, or material using woven fabric or nonwoven fabric are excellent in mechanical characteristics such as the film strength, tensile elastic modulus, and break elongation, high reliability can be achieved.

When the first terminals 14 and the second terminals 15 are used to function as connect terminals to mount the wiring board 11 on a board, it is preferable that the insulating layers 18a and 18c be made of material having a high mechanical strength, such as polyimide resin, PBO, or material using woven fabric or nonwoven fabric. Further, it is preferable that the insulating layers 18b, which are the intermediate layers of the wiring board 11, be made of material having excellent electric characteristics and low loss such as BCB resin, epoxy resin, or epoxy acrylate resin, while these materials have a less mechanical strength than polyimide resin, PBO, and material using woven fabric or nonwoven fabric. By combining the insulating layers 18a, 18b, and 18c as described above, generation of cracks after the wiring board 11 is mounted on a board can be prevented effectively, and a wiring board having both a high mechanical strength and excellent electric characteristics can be realized. In example 3, each of the insulating layers 18a and 18c is made of photosensitive polyimide with a thickness of 10 μm, and the insulating layers 18b are made of nonphotosensitive polyimide having a lower permittivity than that of the insulating layer 18a. Depending on the required performance, the insulating layer 18a may be made of material different from that of the insulating layer 18c.

Since each of first terminals 14 has an area connected to a land 16 thereabove via an adhesion layer 21 and a surface area exposed on the first surface 12, it is desirable that the area be larger than the surface area. Thus, it is effective to make the insulating layers 18a of photosensitive resin.

Since the second terminals 15 may primarily be used for connection with a semiconductor element(s) (not illustrated) at a short distance, it is desirable that the surface area of each second terminal 15 exposed on the second surface 13 be larger than the border area between the second terminal 15 and the wiring layer 17 thereunder, as illustrated in FIG. 7. Based on this structure, stable connection reliability can be ensured even at minute connect points that require short-distance connection. Further, since the size of each second terminal 15 can be increased within a limited area, connection reliability can be ensured more effectively than when additional connect terminals need to be arranged.

The wiring board according to example 3 provides the same meritorious effects as those provided by the wiring board according to example 1. Further, in addition to excellent electric characteristics, the wiring board according to example 3 has a higher mechanical strength than that of the wiring board according to example 2. By increasing the surface area of each of the second terminals 15, even when the second terminals 15 are connected to semiconductor elements at a short distance, connection reliability can be effectively improved.

In examples 1 to 3, capacitors functioning as circuit noise filters may be arranged at desired positions of the circuit formed as the wiring board 11. It is preferable that examples of the dielectric material forming such capacitors include: metal oxide such as titanium oxide, tantalum oxide, $Al_2O_3$, $SiO_2$, $ZrO_2$, $HfO_2$, or $Nb_2O_5$; perovskite-type material such as BST ($Ba_xSr_{1-x}TiO_3$), PZT ($PbZr_xTi_{1-x}O_3$), or PLZT ($Pb_{1-y}La_yZr_xTi_{1-x}O_3$); and Bi-based layer compound such as $SrBi_2Ta_2O_9$, (provided that $0 \leq x \leq 1$, $0 < y < 1$). Alternatively, for example, an organic material to which an inorganic material or a magnetic material is added may be used as the dielectric material forming the capacitors. Furthermore, capacitors functioning as circuit noise filters may be arranged, by making a single insulating layer 18 or a plurality of insulating layers 18 of material having a dielectric constant of 9 or more and by forming counter electrodes at desired positions of the wiring layers above and below the insulating layer(s) 18. It is preferable that examples of the dielectric material forming such capacitors include: metal oxide such as $Al_2O_3$, $ZrO_2$, $HfO_2$, or $Nb_2O_5$; perovskite-type material such as BST ($Ba_xSr_{1-x}TiO_3$), PZT ($PbZr_xTi_{1-x}O_3$), or PLZT ($Pb_{1-y}La_yZr_xTi_{1-x}O_3$); and Bi-based layer compound such as $SrBi_2Ta_2O_9$, (provided that $0 \leq x \leq 1$, $0 < y < 1$). Alternatively, for example, an organic material to which an inorganic material or a magnetic material is added may be used as the dielectric material forming the capacitors.

Example 4

A semiconductor device according to example 4 of the present invention will be described with reference to the drawings. FIG. 8 is a schematic partial cross section of the semiconductor device according to example 4 of the present invention.

The semiconductor device according to example 4 is formed by flip-chip connecting semiconductor elements 22a and 22b to both sides of a wiring board 11. The wiring board 11 is a multilayered wiring board in which insulating layers 18 and wiring layers 17 (lands 16 where first terminals 14 are connected) are alternately laminated and vias 19 connect the wiring layers 17. The wiring board 11 has a first surface 12 and a second surface 13. The first surface 12 is formed by an insulating layer 18, and the first terminals 14 are embedded in prepared holes formed in this insulating layer 18. The second surface 13 is formed by another insulating layer 18, and the second terminals 15 are embedded in prepared holes formed in this insulating layer 18. The surface of each of the first terminals 14 on the second surface 13 side is connected to a land 16 via an adhesion layer 21. Each of the lands 16 is directly connected to a wiring layer 17 in the same layer and is also connected to an upper wiring layer 17 via a via 19. Each wiring layer 17 is connected to a wiring layer 17 thereabove via a via 19. Namely, since the end portion of each of the vias 19 on the first surface 12 side is directly connected to a land 16 or a wiring layer 17 without an adhesion layer 21, a connecting interface is not formed between each via 19 and the land 16 or the wiring layer 17 immediately below. Further, since the end portion of each of the vias 19 on the second surface 13 side is connected to a wiring layer 17 above via another adhesion layer 21, a connecting interface is formed between each via 19 and the wiring layer 17 immediately above. In addition, since the end portion of each of the second terminals 15 on the first surface 12 side is directly connected to a wiring layer 17 without an adhesion layer 21, a connecting interface is not formed between each of the second terminals 15 and the wiring layer 17 immediately below. Not only the surface connected to the via 19 below, the whole surface of each of the wiring layer 17 on the first surface 12 side is connected to the adhesion layer 21 immediately below. Thus, each of the wiring layers 17 is firmly bonded to the insulating layer 18 below via the adhesion layer 21. Further, not only the surface connected to the first terminal 14 below, the whole surface of each of the lands 16 on the first surface 12 side is connected to the adhesion layer 21 immediately below. Thus, each of the lands 16 is firmly attached to the insulating layer 18 below via the adhesion layer 21. On the first surface 12, the semiconductor element 22b and a first terminal 14 are connected via a solder 23b, and a gap between the semiconductor element 22b and the wiring board 11 is filled with an underfill 24b. Further, on a first terminal 14 on the first surface 12 arranged around the semiconductor element 22b, a solder ball 25 for mounting the wiring board 11 on a board (not illustrated) is attached. On the second surface 13, the semiconductor element 22a and a second terminal 15 are connected via a solder 23a, and a gap between the semiconductor element 22a and the wiring board 11 is filled with an underfill 24a.

In FIG. 8, a wiring board identical to that according to example 1 (see FIG. 1) is used as the wiring board 11. However, the wiring board according to example 2 or 3 (see FIGS. 6 and 7) may be used.

The semiconductor element 22a is mounted by a flip-chip connection and includes an electrode (not illustrated) on one surface thereof. The electrode (not illustrated) is electrically connected to the second terminal 15 via the solder 23a, and a gap between the semiconductor element 22a and the wiring board 11 is filled with the underfill 24a.

The semiconductor element 22b is mounted by a flip-chip connection and includes an electrode (not illustrated) on one surface thereof. The electrode (not illustrated) is electrically connected to the first terminal 14 via the solder 23b, and a gap between the semiconductor element 22b and the wiring board 11 is filled with the underfill 24b.

The underfills 24a and 24b are resin used to minimize the difference in thermal expansion coefficients between the wiring board 11 and the semiconductor element 22a and between the wiring board 11 and the semiconductor element 22b, respectively. Namely, the underfills 24a and 24b are used to prevent fracture of the solders 23a and 23b, respectively. The underfills 24a and 24b are made of epoxy-type material and are applied when or after the semiconductor elements 22a and 22b are mounted, respectively. As long as the solders 23a and 23b are strong enough to ensure desired reliability, application of the underfills 24a and 24b is not necessarily needed.

The solders 23a and 23b are made of tin, lead, indium, zinc, gold, or an alloy of these materials. Material for the solders 23a and 23b can be suitably selected from lead-tin eutectic solder materials or lead-free solder materials. The solders 23a and 23b are formed on the electrodes of the semiconductor elements 22a and 22b by a plating method, a ball transfer method, or a printing method.

The solder ball 25 is a ball made of solder material and is used to mount a semiconductor device on a board (not illustrated). The solder ball 25 is attached on a first terminal 14 located outside the area where the semiconductor element 22b is mounted. The solder ball 25 can be formed on the first terminal 14 by a ball transfer method or a printing method. Depending on the installation mode, a metal pin may be soldered on the first terminal 14, instead of the solder ball 25. Even when a metal pin is soldered, the side of the first terminal 14 has a connecting portion with solder.

While not illustrated, when the wiring board 11 lacks rigidity, a frame (stiffener) having an opening that corresponds to the semiconductor element 22a may be additionally attached to an area of the semiconductor device according to example 4 where the semiconductor element 22a is not mounted. In this way, the wiring board 11 can be reinforced.

In FIG. 8, the semiconductor elements 22a and 22b are mounted on the top and bottom surfaces of the wiring board 11, respectively. However, the present invention is not limited to such example. A single semiconductor element or a plurality of semiconductor elements may be mounted on the first surface 12 or the second surface 13. Further, by using the structure of FIG. 8, a plurality of semiconductor elements or electronic devices may be mounted on each of the first surface 12 and the second surface 13.

In FIG. 8, the semiconductor elements 22a and 22b are connected at the shortest distance by vias 19 and wiring layers 17 laminated in the wiring board 11. Based on a semiconductor device using the wiring board 11, these elements can be connected at the shortest distance. Thus, for example, by combining logic and memory semiconductor elements, a single semiconductor element can be formed. Since such combination is possible, costs for manufacturing semiconductor elements can be reduced effectively. Thus, costs for manufacturing a semiconductor device as a whole can be reduced.

In FIG. 8, the semiconductor element 22a above the second surface 13 is exposed. However, molding may be carried out by using organic resin to protect the semiconductor element 22a and to ensure rigidity of the semiconductor device.

Further, a second terminal(s) 15 may be formed on the second surface 13 as a connecting terminal(s) for a board (not illustrated) or another semiconductor device.

According to example 4, since the connecting interface between each via 19 and a wiring layer 17 immediately above is formed at a region where the adhesion layer 21 is formed, the insulating layers 18 are corrected by the wiring layers 17, and concentration of stress at such connecting interface can be reduced effectively. Even when the vias 19 have a minute diameter, a semiconductor device having a high connection reliability can be realized. In addition, by mounting the semiconductor elements 22b and 22a on the first surface 12 side and the second surface 13 side, respectively, these elements can be connected by a lamination of vias 19 and wiring layers 17, namely, by the thickness of the wiring board 11. Thus, a semiconductor device having transmission characteristics equal to those of a single semiconductor element and having higher throughput can be realized.

Example 5

Figure 9:
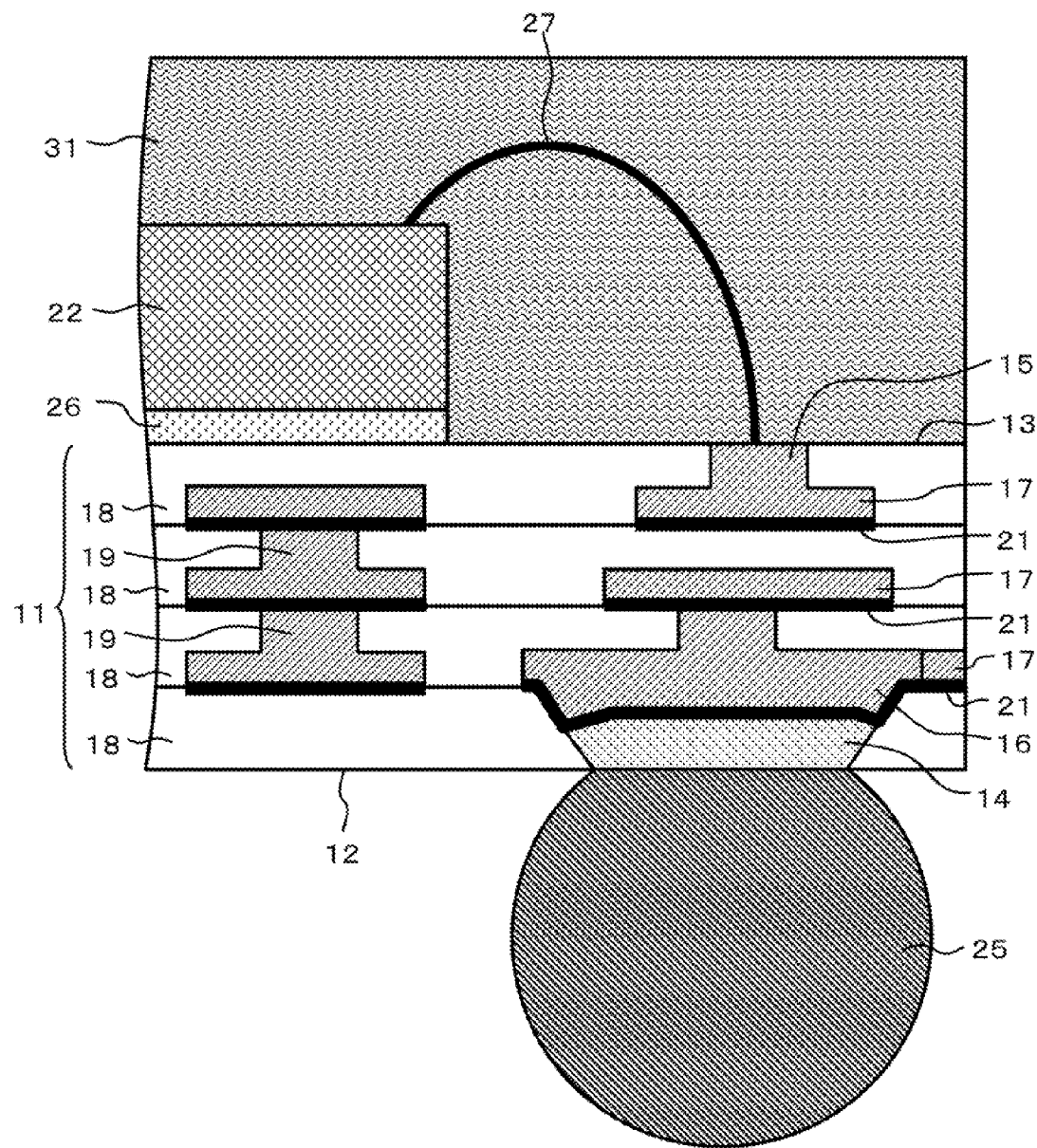
FIG. 9 is a schematic partial cross section of a semiconductor device according to example 5 of the present invention.

A semiconductor device according to example 5 of the present invention will be described with reference to the drawings. FIG. 9 is a schematic partial cross section of the semiconductor device according to example 5 of the present invention.

The semiconductor device according to example 5 is different from the semiconductor device according to example 4 in that a semiconductor element is mounted by a bonding wire.

Based on the semiconductor device according to example 5, a semiconductor element 22 is mounted on a wiring board 11, and the wiring board 11 and the semiconductor element 22 are connected by a bonding wire 27. The wiring board 11 is a multilayered wiring board in which insulating layers 18 and wiring layers 17 (lands 16 where first terminals 14 are connected) are alternately laminated and vias 19 connect the wiring layers 17. The wiring board 11 has a first surface 12 and a second surface 13. The first surface 12 is formed by an insulating layer 18, and the first terminals 14 are embedded in prepared holes formed in this insulating layer 18. The second surface 13 is formed by another insulating layer 18, and the second terminals 15 are embedded in prepared holes formed in this insulating layer 18. The surface of each of the first terminals 14 on the second surface 13 side is connected to a land 16 via an adhesion layer 21. Each of the lands 16 is directly connected to a wiring layer 17 in the same layer and is also connected to an upper wiring layer 17 via a via 19. Each wiring layer 17 is connected to a wiring layer 17 thereabove via a via 19. Namely, since the end portion of each of the vias 19 on the first surface 12 side is directly connected to a land 16 or a wiring layer 17 without an adhesion layer 21, a connecting interface is not formed between each via 19 and the land 16 or the wiring layer 17 immediately below. Further, since the end portion of each of the vias 19 on the second surface 13 side is connected to a wiring layer 17 above through another adhesion layer 21, a connecting interface is formed between each via 19 and the wiring layer 17 immediately above. In addition, since the end portion of each of the second terminals 15 on the first surface 12 side is directly connected to a wiring layer 17 without any adhesion layer 21, a connecting interface is not formed between each of the second terminals 15 and the wiring layer 17 immediately below. Not only the surface connected to the via 19 below, the whole surface of each of the wiring layer 17 on the first surface 12 side is connected to the adhesion layer 21 immediately below. Thus, each of the wiring layers 17 is firmly secured to the insulating layer 18 below through the adhesion layer 21. Further, not only the surface connected to the first terminal 14 below, the whole surface of each of the lands 16 on the first surface 12 side is connected to the adhesion layer 21 immediately below. Thus, each of the lands 16 is firmly secured to the insulating layer 18 below through the adhesion layer 21. The semiconductor element 22 is fixed to the second surface 13 via an adhesive material 26 and is electrically connected to the second terminal 15 through the bonding wire 27. A mold 31 is formed on the second surface 13 to cover the semiconductor element 22 and the bonding wire 27. On the first terminal 14 on the first surface 12, a solder ball 25 is formed to mount the wiring board 11 on a board (not illustrated).

In FIG. 9, as the wiring board 11, a wiring board similar to that according to example 1 (see FIG. 1) is illustrated. However, a wiring board as described in example 2 or 3 (see FIG. 6 and FIG. 7) may be used.

The adhesive material 26 is applied on a surface (back side) of the semiconductor element 22, that is, on a surface where no circuit of the semiconductor element 22 is formed, and the semiconductor element 22 is bonded to the second surface 13 of the wiring board 11. The adhesive material 26 can be made of organic material, Ag paste, or the like.

The bonding wire 27 is primarily made of gold and electrically connects an electrode (not illustrated) of the semiconductor element 22 and a second terminal 15.

The mold 31 can be made of a mixture of epoxy-type material and silica filler, for example. The mold 31 is formed to cover the mounted semiconductor element 22 and the connecting wiring by a transfer molding method using a metal mold, a compression molding method, a printing method, or the like. In FIG. 9, the mold 31 covers the whole surface of one side of the wiring board 11, including the semiconductor element 22. However, the mold 31 may be formed to cover part of the wiring board 11, including the semiconductor element 22.

In FIG. 9, the semiconductor element 22 is mounted only on the second surface 13. However, as in example 4 (see FIG. 8), an additional semiconductor element may also be formed on the first surface 12. Alternatively, a semiconductor element may be formed only on the first surface 12. When a plurality of semiconductor elements are mounted on both sides or one side, a combination of the bonding wire connection according to example 5 and the flip-chip connection according to example 4 may be used.

According to example 5, since the semiconductor element 22 is covered with the mold 31, the semiconductor element 22 can be protected. In addition, by forming the mold 31, rigidity of the semiconductor device as a whole can be increased, whereby reliability of the semiconductor device as a whole can be improved.

According to examples 4 and 5, capacitors functioning as circuit noise filters may be arranged at desired positions of the circuit formed as the wiring board 11. It is preferable that examples of the dielectric material forming such capacitors include: metal oxide such as titanium oxide, tantalum oxide, $Al_2O_3$, $SiO_2$, $ZrO_2$, $HfO_2$, or $Nb_2O_5$; perovskite-type material such as BST ($Ba_xSr_{1-x}TiO_3$), PZT ($PbZr_xTi_{1-x}O_3$), or PLZT ($Pb_{1-y}La_yZr_xTi_{1-x}O_3$); and Bi-based layer compound such as $SrBi_2Ta_2O_9$, (provided that $0 \leq x \leq 1$, $0 < y < 1$). Alternatively, for example, an organic material to which an inorganic material or a magnetic material is added may be used as the dielectric material forming the capacitors. Furthermore, capacitors functioning as circuit noise filters may be arranged, by making a single insulating layer 18 or a plurality of insulating layers 18 of material having a dielectric constant of 9 or more and by forming counter electrodes at desired positions of the wiring layers above and below the insulating layer(s) 18. It is preferable that examples of the dielectric material forming such capacitors include: metal oxide such as $Al_2O_3$, $ZrO_2$, $HfO_2$, or $Nb_2O_5$; perovskite-type material such as BST ($Ba_xSr_{1-x}TiO_3$), PZT ($PbZr_xTi_{1-x}O_3$), or PLZT ($Pb_{1-y}La_yZr_xTi_{1-x}O_3$); and Bi-based layer compound such as $SrBi_2Ta_2O_9$, (provided that $0 \leq x \leq 1$, $0 < y < 1$). Alternatively, for example, an organic material to which an inorganic material or a magnetic material is added may be used as the dielectric material forming the capacitors.

Example 6

A wiring board manufacturing method according to example 6 of the present invention will be described with reference to the drawings. FIGS. 10 to 14 are schematic sectional views of steps of the wiring board manufacturing method according to example 6 of the present invention.

The wiring board manufacturing method according to example 6 is a method for manufacturing the wiring boards according to examples 1 and 2 (FIGS. 1 and 6). Between steps described below, plasma, cleaning, or thermal treatment shall be implemented when appropriate.

Figure 10A:
FIGS. 10A to 10D are schematic sectional views of a first step of a wiring board manufacturing method according to example 6 of the present invention.

First, a support 33 is prepared, and if necessary, treatment such as wet cleaning, dry cleaning, planarization, or roughening is implemented on the surface (see step A1 in FIG. 10A). Since it is desirable that the support 33 have suitable rigidity, for example, the support 33 may be made of semiconductor wafer material such as silicon, sapphire, or GaAs. Alternatively, a metal, quartz, glass, ceramic, or printed board may be used. In example 6, an 8-inch silicon wafer with a thermally-oxidized film is used as the support 33 (diameter: 200 mm and thickness: 0.725 mm).

Figure 10B:
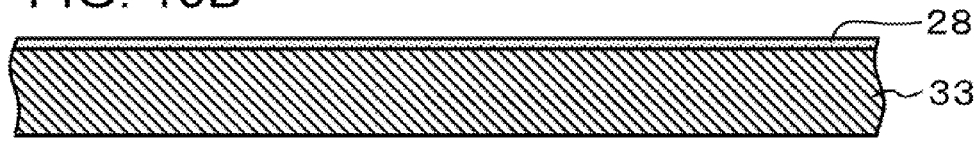

Next, a conductor film 28 is formed on the support 33 (see step A2 in FIG. 10B). For example, the conductor film 28 functions as a feed layer when an electrolytic plating method is used or as a catalyst layer when an electroless plating method is used in a step illustrated in FIG. 10D. The conductor film 28 has a surface made of copper, aluminum, palladium, gold, platinum, silver, or an alloy of these materials, for example. It is desirable that the conductor film 28 be formed as a single layer or formed as a lamination of a plurality of metal materials. It is more desirable that the conductor film 28 be formed as a single layer of copper. In example 6, a copper sputtered film is used as the conductor film 28.

Figure 10C:
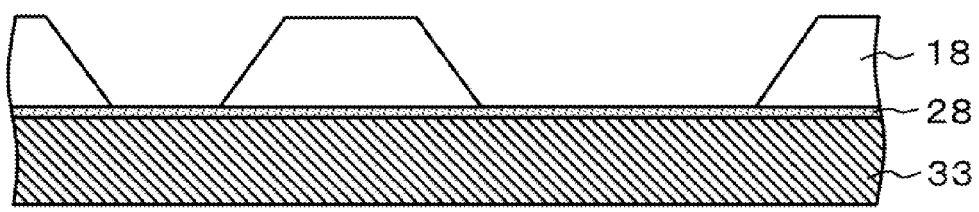

Next, an insulating layer 18 having openings is formed on the conductor film 28 to form first terminals (14 in FIG. 10D) (see step A3 in FIG. 10C). The insulating layer 18 is made of photosensitive or nonphotosensitive organic material, for example. For example, epoxy resin, epoxy acrylate resin, urethane acrylate resin, polyester resin, phenol resin, polyimide resin, benzocyclobutene (BCB), polybenzoxazole (PBO), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB, PBO, polynorbornene resin, or the like may be used as the organic material. Particularly, since polyimide resin, PBO, or material using woven fabric or nonwoven fabric are excellent in mechanical characteristics such as the film strength, tensile elastic modulus, and break elongation, high reliability can be achieved. If a liquid organic material is used, the insulating layer 18 can be formed by a spin coating method, a curtain coating method, a die coating method, a spraying method, printing method, or the like. If a film organic material is used, the insulating layer 18 can be formed by a lamination method, a pressing method, or the like. If a photosensitive organic material is used, the openings in the insulating layers 18 where the first terminals 14 are formed can be formed by a photolithography method. If a nonphotosensitive organic material or photosensitive organic material having a low pattern resolution is used, the openings in the insulating layer 18 can be formed by a laser processing method, a dry etching method, or a blasting method. In example 6, photosensitive polyimide resin with a thickness of 7 µm is used as the insulating layers 18, and a photolithography method is employed to form the openings.

Figure 10D:
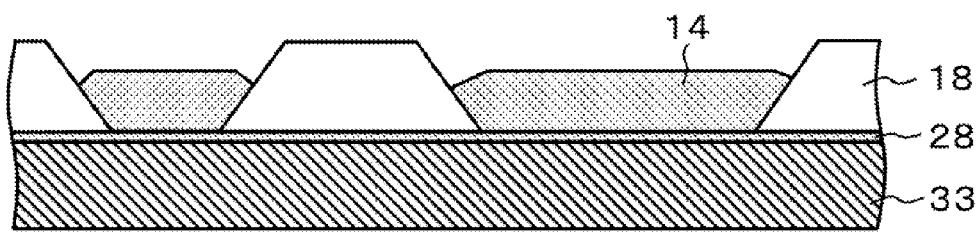
Figure 11A:
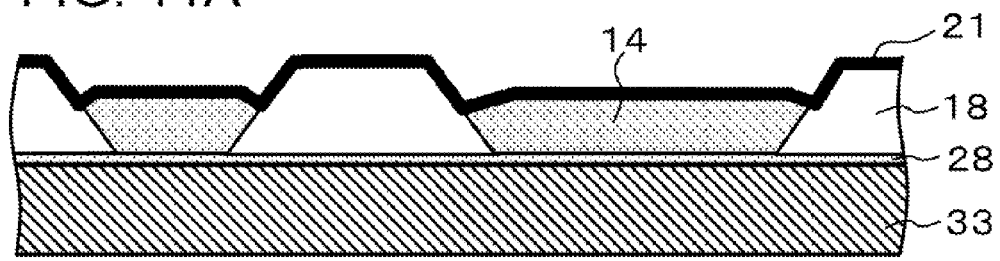
FIGS. 11A to 11C are schematic sectional views of a second step of the wiring board manufacturing method according to example 6 of the present invention.

Next, the first terminals 14 are formed in the openings in the insulating layer 18 (see step A4 in FIG. 10D). Each of the first terminals 14 is formed as a single metal layer or a plurality of metal layers. The metal layer can be primarily made of material such as copper, nickel, gold, or silver. Alternatively, the metal layer can be made of an alloy. The first terminals 14 can be formed by using the insulating layer 18 as a mask and implementing an electrolytic plating method, an electroless plating method, a printing method, an evaporation method, or the like. By forming the first terminals 14 to have a thickness less than that of the insulating layer 18, a feed layer (adhesion layer 21) can also be formed on the side walls of the openings in the insulating layer 18, as illustrated in FIG. 11A. In example 6, by implementing feeding via the support 33, Cu of 2 µm and Ni of 3 µm are laminated on the conductor film 28 in this order, and each first terminal 14 is formed so that the surface thereof is depressed from the top surface of the insulating layer 18 by approximately 2 µm.

Next, the feed layer (adhesion layer 21) is formed so that the feed layer covers the insulating layer 18 and the first terminals 14 (see step A5 in FIG. 11A). The feed layer (adhesion layer 21) will be the adhesion layer 21 that attaches to the insulating layer 18, the lands 16, and the wiring layers 17 as illustrated in FIG. 11C. Further, the feed layer (adhesion layer 21) has a laminated structure having a metal layer as its surface layer so that the feed layer (adhesion layer 21) is appropriately used for forming wirings in a step illustrated in FIG. 11C. Thus, to form the feed layer (adhesion layer 21) having a laminated structure, first, titanium, tungsten, nickel, tantalum, vanadium, chromium, molybdenum, copper, aluminum, an alloy of these materials, or the like is formed on the insulating layer 18. Next, copper, aluminum, palladium, gold, platinum, silver, an alloy of these materials, or the like is formed as the surface of the feed layer. The feed layer (adhesion layer 21) is formed by an electroless plating method, a sputtering method, a chemical vapor deposition (CVD) method, or the like. In example 6, TiW having a thickness of 80 nm is formed on the insulating layer 18 and copper of a thickness of 200 nm is formed on the TiW by using a sputtering method.

Figure 11B:
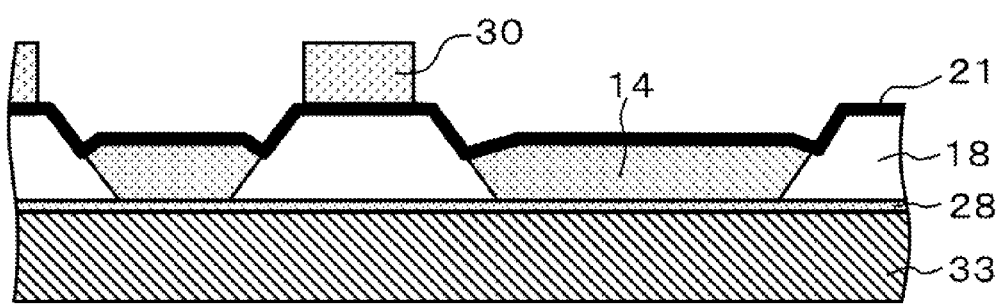
Figure 11C:
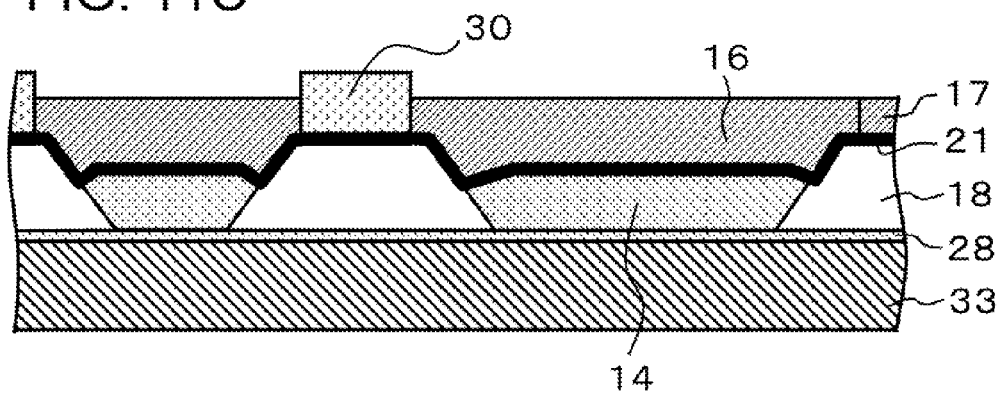

Next, a resist 30 is formed on the feed layer (adhesion layer 21), and patterning is implemented so that openings can be made in the resist 30 for portions used as the lands (16 in FIG. 11C) and the wiring layers (17 in FIG. 11C) (see step A6 in FIG. 11B). If a liquid material is used, the resist 30 can be formed by a spin coating method, a curtain coating method, a die coating method, a spraying method, printing method, or the like. If a film material is used, the resist film 30 can be formed by a lamination method, a pressing method, or the like. The resist film 30 is made of epoxy resin, epoxy acrylate resin, phenol resin, novolak resin, polyimide resin, or the like and functions as a protective film for portions where the wiring layers 17 are not formed in a step illustrated in FIG. 11C. The patterning is implemented by a photolithography method, a direct writing method, or the like. In example 6, material having novolak resin as a primary component is used as the resist film 30, and the resist film 30 having a thickness of 10 µm is formed.

Next, the lands 16 and the wiring layers 17 are formed on the feed layer (adhesion layer 21) exposed from the openings of the resist film 30 (see step A7 in FIG. 11C). While the lands 16 and the wiring layers 17 can be primarily made of any one of copper, gold, nickel, aluminum, silver, and palladium or a plurality of these materials, copper is most preferable in view of the resistance and cost. If nickel is used, interfacial reaction with other materials such as insulating material can be prevented, and by utilizing characteristics as a magnetic material, the lands 16 and the wiring layers 17 can be used as inductors or resistance wirings. While the lands 16 and the wiring layers 17 can be formed by a semi-additive process, other methods such as a subtractive process, a fully-additive process, or the like may be used. The subtractive process is a method for obtaining a desired pattern, and based on this process, first, a resist of a desired pattern is formed on a copper foil arranged on a board. A desired pattern can be obtained by etching unnecessary copper foil and exfoliating the resist. A fully-additive process is a method for obtaining a desired wiring pattern by adsorbing an electroless plating catalyst on a board, forming a resist pattern, activating the catalyst while leaving the resist film as an insulating film, and depositing metal in the openings of the insulating film by an electroless plating method. Alternatively, the lands 16 and the wiring layers 17 may be made by another method in which depressed portions used for a wiring pattern are arranged in the insulating layer (not illustrated) where the lands 16 and the wiring layers 17 are arranged, a feed layer is next formed through an electroless plating method, a sputtering method, a chemical vapor deposition (CVD) method, or the like, the depressed portions are filled through an electroless plating method or an electrolytic plating method, and the surface is adjusted by polishing. While metal posts (vias 19 in FIG. 12B) are formed on the lands 16 and the wiring layers 17, when these methods are used, care must be taken to prevent formation of a connecting interface of different materials between a land 16 and a metal post and between a wiring layer 17 and a metal post. In example 6, copper wirings having a thickness of 5 µm is formed by an electrolytic plating method as the lands 16 and the wiring layers 17.

Figure 12A:
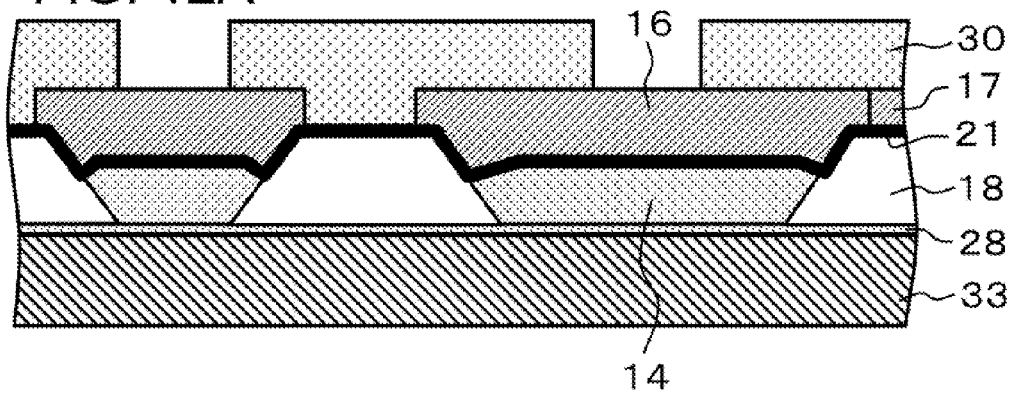
FIGS. 12A to 12C are schematic sectional views of a third step of the wiring board manufacturing method according to example 6 of the present invention.

Next, the resist 30 is formed on the feed layer 21 [sic. land 16] and the wiring layers 17, and patterning is carried out to form openings for the metal posts (vias 19 in FIG. 12B) (see step A8 in FIG. 12A). If a liquid material is used, the resist 30 can be formed by a spin coating method, a curtain coating method, a die coating method, a spraying method, printing method, or the like. If a film material is used, the resist film 30 can be formed by a lamination method, a pressing method, or the like. The resist film 30 is made of epoxy resin, epoxy acrylate resin, phenol resin, novolak resin, polyimide resin, or the like and functions as a protective film for portions where the metal posts (vias 19) are not formed in a step illustrated in FIG. 12B. The patterning is implemented by a photolithography method, a direct writing method, or the like. In example 6, material having novolak resin as a primary component is used as the resist film 30, and the resist film 30 having a thickness of 10 µm is formed. In step A8, an additional resist 30 is formed, without removing the resist 30 formed in step A6 (see FIG. 11B). However, the resist film 30 formed in step A6 (see FIG. 11B) may be removed after step A7 and a new resist film 30 may be formed thereafter.

Figure 12B:
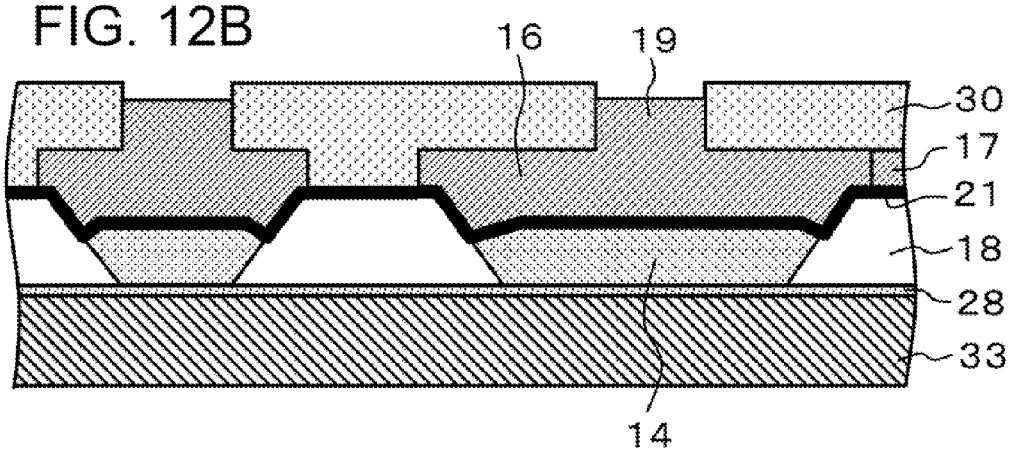

Next, as illustrated in FIG. 12B, the metal posts (vias 19) are formed on the lands 16 and the wiring layers 17 exposed from the openings of the resist film 30 (see step A9 in FIG. 12B). While the metal posts (vias 19) can be primarily made of any one of copper, gold, nickel, aluminum, silver, and palladium or a plurality of these materials, copper is most preferable in view of the resistance and cost. If nickel is used, interfacial reaction with other materials such as insulating material can be prevented, and by utilizing characteristics as a magnetic material, the lands 16 and the wiring layers 17 can be used as inductors or resistance wirings. In example 6, copper having a thickness of 5 µm is formed by an electrolytic plating method as the metal posts (vias 19).

Figure 12C:
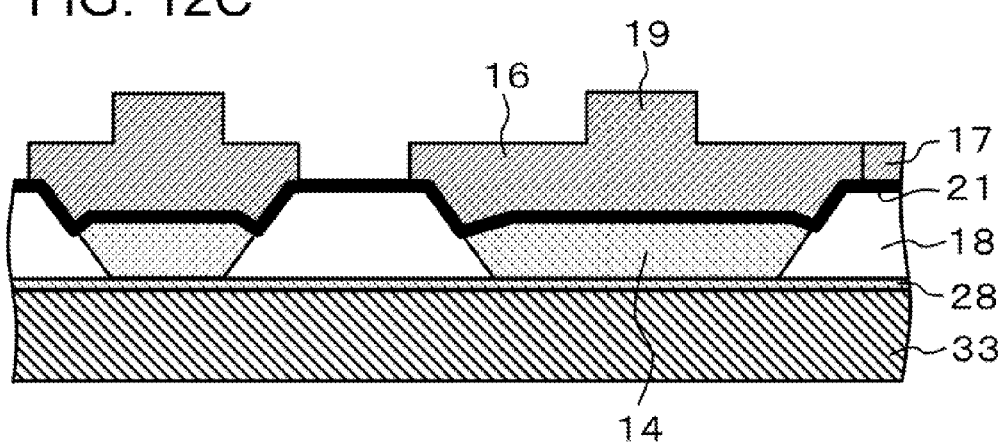

Next, the resist 30 is removed (see step A10 in FIG. 12C). The resist film 30 can be removed by a wet etching method using stripper liquid, a dry etching method, or a combination of these methods. In example 6, stripper liquid for the resist film 30 is used.

Figure 13A:
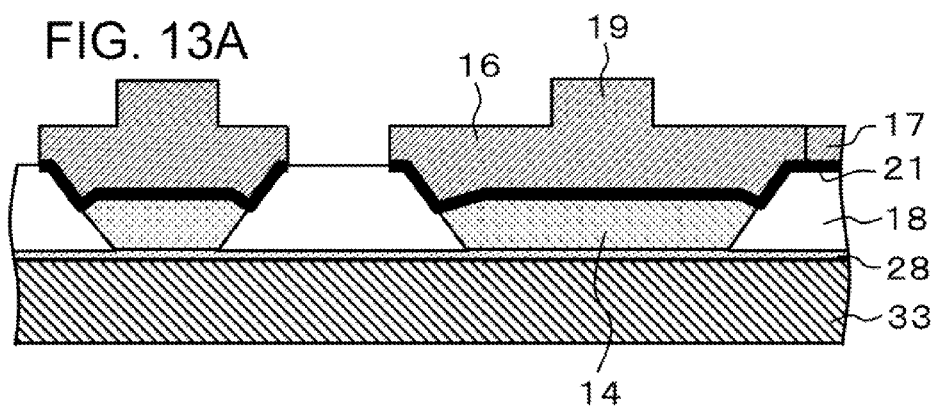
FIGS. 13A to 13C are schematic sectional views of a fourth step of the wiring board manufacturing method according to example 6 of the present invention.

Next, the exposed feed layer (adhesion layer 21) is removed (see step A11 in FIG. 13A). The feed layer (adhesion layer 21) can be removed by a wet etching method, a dry etching method, or a combination of these methods. In example 6, the copper and TiW used as the feed layer (adhesion layer 21) is removed by a wet etching method.

Figure 13B:
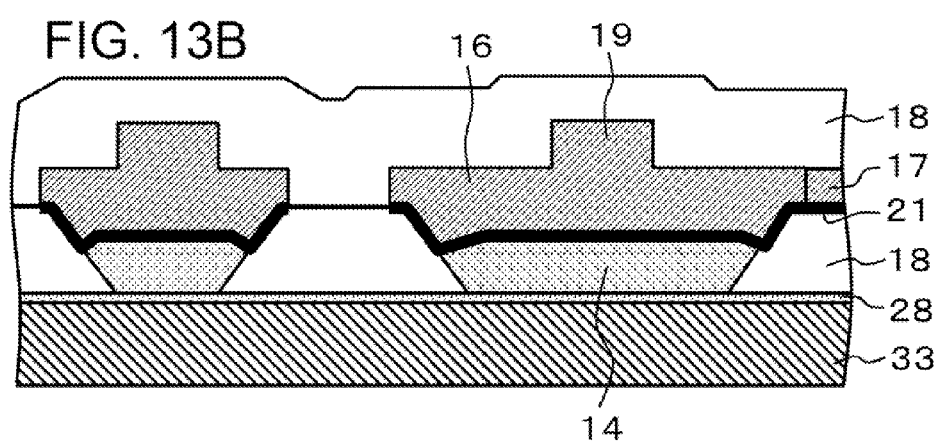

Next, an insulating layer 18 is formed to cover the lands 16, the wiring layers 17, the insulating layer 18, and the metal posts (vias 19) (see step A12 in FIG. 13B). For example, photosensitive or nonphotosensitive organic material may be used as the insulating layer 18. For example, epoxy resin, epoxy acrylate resin, urethane acrylate resin, polyester resin, phenol resin, polyimide resin, benzocyclobutene (BCB), polybenzoxazole (PBO), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB, PBO, polynorbornene resin, or the like may be used as the organic material. Particularly, since polyimide resin, PBO, or material using woven fabric or nonwoven fabric are excellent in mechanical characteristics such as the film strength, tensile elastic modulus, and break elongation, high reliability can be achieved. If a liquid organic material is used, the insulating layer 18 can be formed by a spin coating method, a curtain coating method, a die coating method, a spraying method, printing method, or the like. If a film organic material is used, the insulating layer 18 can be formed by a lamination method, a pressing method, or the like. In example 6, nonphotosensitive polyimide resin is used to form the insulating layer 18 having a thickness of 12 µm by a spin coating method.

Figure 13C:
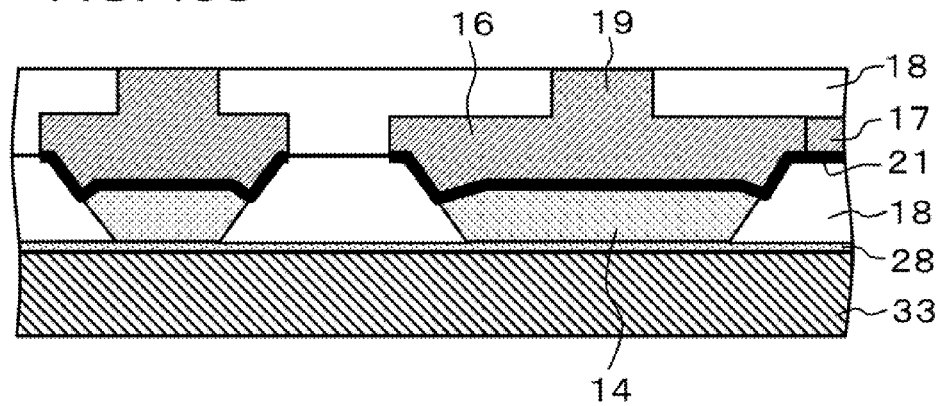

Next, the surface of the insulating layer 18 is polished until the metal posts (vias 19) are exposed (see step A13 in FIG. 13C). The insulating layers 18 may be polished by a plane polishing method, a chemical mechanical polishing (CMP) method, a grinding method, a buffing method, a sand blasting method, or the like. In example 6, the insulating layer 18 is polished by a CMP method.

Next, the steps as illustrated in steps A5 to A13 (FIGS. 11A to 13C) are repeated. In this way, the wiring layers 17 and the insulating layers 18 are alternately laminated, and multiple wiring layers in which the wiring layers 17 are connected by the vias 19 can be formed (see step A14 in FIG. 14A). In the multiple wiring layers, an adhesion layer 21 is formed on the bottom surface of each of the wiring layers 17, and second terminals 15 (metal posts) are exposed from a second surface 13. For example, the second terminals 15 can be formed by laminating a plurality of layers such as copper, nickel, palladium, platinum, gold, silver, tin, and aluminum. In view of wettability of a solder ball or connectivity to a bonding wire formed on the surfaces of the second terminals 15, it is preferable that the surfaces of the second terminals 15 be formed of at least one kind of metal or an alloy selected from the group consisting of gold, silver, copper, tin, and solder material. The second terminals 15 can be formed to be depressed from the second surface 13 as illustrated in FIG. 4, by implementing a wet or dry etching method after the metal posts (second terminals 15) are exposed. In this case, to control the amount of etching, the metal posts (second terminals 15) may be formed by laminating metals having different etching rates, and the metal exposed on the surface layer may be removed. To allow the second terminals 15 to protrude from the second surface 13 as illustrated in FIG. 5, during or after the step of exposing the metal posts (second terminals 15), the insulating layer 18 may be removed so that the metal posts (second terminals 15) protrude from the second surface 13. Alternatively, after the metal posts (second terminals 15) are exposed, the second terminals 15 may be formed by an electrolytic plating method, an electroless plating method, an evaporation method, a printing method, an ink-jet method, a dip method, or the like. In example 6, after the metal posts (second terminals 15) made of copper are exposed from the second surface 13 by a CMP method, 3 µm of nickel and 0.5 µm of gold (the surface) are laminated by an electroless plating method.

Next, the support 33 is removed (see step A15 in FIG. 14B). The support 33 may be removed by a peeling method using a low adhesion layer. Alternatively, a supporting substrate may be peeled by using a transparent substrate and changing properties of the material in contact with the supporting substrate through laser light or ultraviolet light. Further alternatively, a supporting substrate may be polished or separated by using a water cutter or a slicer at a desired position. In example 6, the support 33 is peeled by using lower adhesion between the thermally-oxidized film of the support 33 (silicon) and the conductor film 28 (Cu thin film).

Next, the conductor film 28 is removed (see step A16 in FIG. 14C). The conductor film 28 can be removed by a wet or dry etching method. After etching, the surfaces of the first terminals 14 may be treated by an electrolytic plating method, an electroless plating method, an evaporation method, a printing method, an ink-jet method, a dip method, or the like, so that the surfaces of the first terminals 14 are made of at least one kind of metal or an alloy selected from the group consisting of gold, silver, copper, tin, and solder material. The first terminals 14 can be depressed from the first surface 12 by a wet or dry etching method during or after the step of exposing the first terminals 14. In this case, to control the amount of etching, the first terminals 14 may be formed by laminating metals having different etching rates, and the metal exposed on the surface layer may be removed. To allow the first terminals 14 to protrude from the first surface 12, during or after the step of exposing the first terminals 14, the insulating layer 18 may be removed so that the first terminals 14 protrude from the first surface 12. Alternatively, after the first terminals 14 are exposed, a metal film may be formed on the first terminals 14 by an electrolytic plating method, an electroless plating method, an evaporation method, a printing method, an ink-jet method, a dip method, or the like. In example 6, a gold film is formed on the exposed surfaces (Cu) of the first terminals 14 by an electroless plating method.

According to example 6, the wiring boards according to examples 1 and 2 can be manufactured efficiently. The wiring board according to example 2 can be manufactured efficiently by using different materials for the insulating layer 18 in which the first terminals 14 are formed and for the other insulating layers 18.

Example 7

A wiring board manufacturing method according to example 7 of the present invention will be described with reference to the drawings. FIGS. 15 to 16 are schematic sectional views of steps of the wiring board manufacturing method according to example 7 of the present invention.

The wiring board manufacturing method according to example 7 is a method for manufacturing the wiring board according to example 3 of the present invention (see FIG. 7). The wiring board manufacturing method according to example 7 includes a step of manufacturing an insulating layer 18c that forms the second surface 13, unlike the wiring board manufacturing method according to example 6. Between steps described below, plasma, cleaning, or thermal treatment shall be implemented when appropriate. Between steps described below, plasma, cleaning, or thermal treatment shall be implemented when appropriate.

Figure 15A:
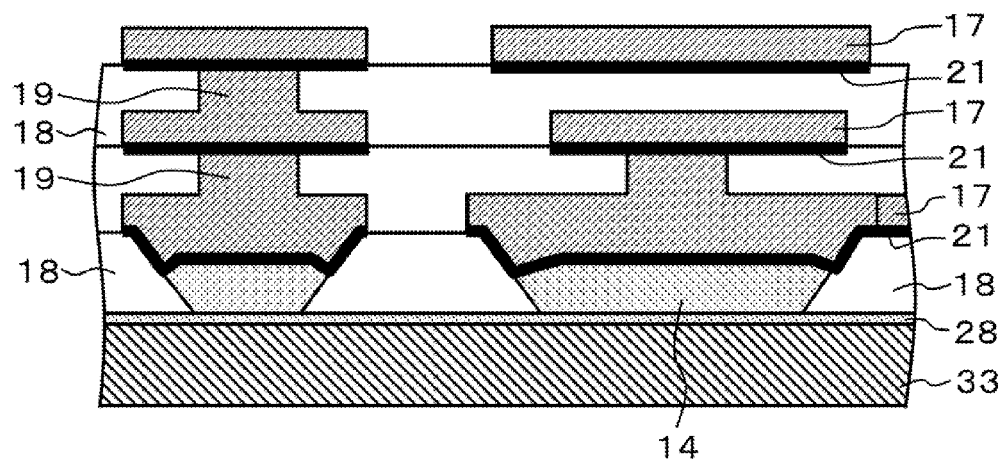
FIGS. 15A and 15B are schematic sectional views of a first step of a wiring board manufacturing method according to example 7 of the present invention.

First, by carrying out steps A1 to A14 (see FIGS. 10A to 14A) of example 6, a wiring-board intermediate body is prepared (see step B1 in FIG. 15A). In FIG. 15A, the insulating layers 18 are formed as in those of the wiring board according to example 1. However, as the insulating layers 18 in the wiring board according to example 2, different materials may be used for the insulating layer 18 in which the first terminals 14 are embedded and for the other insulating layers 18.

Figure 15B:
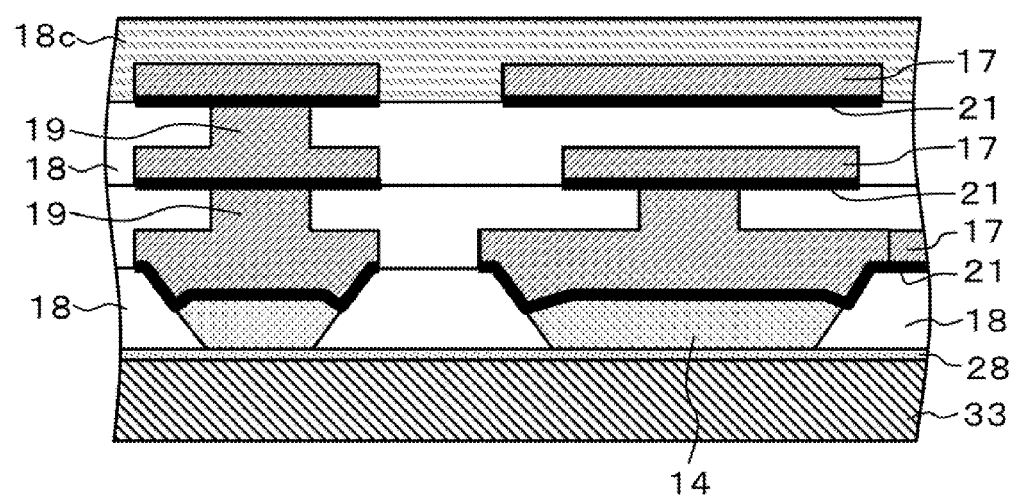

Next, an insulating layer 18c is formed on the wiring layer 17 and the insulating layer 18 (see step B2 in FIG. 15B). For example, photosensitive or nonphotosensitive organic material may be used as the insulating layer 18c. For example, epoxy resin, epoxy acrylate resin, urethane acrylate resin, polyester resin, phenol resin, polyimide resin, benzocyclobutene (BCB), polybenzoxazole (PBO), polynorbornene resin, or the like may be used as the organic material. Alternatively, material obtained by impregnating woven fabric or nonwoven fabric formed of glass cloth, aramid fiber, or the like with epoxy resin, epoxy acrylate resin, urethane acrylate resin, polyester resin, phenol resin, polyimide resin, BCB, PBO, polynorbornene resin, or the like may be used as the organic material. Particularly, since polyimide resin, PBO, or material using woven fabric or nonwoven fabric are excellent in mechanical characteristics such as the film strength, tensile elastic modulus, and break elongation, high reliability can be achieved. If a liquid organic material is used, the insulating layer 18c can be formed by a spin coating method, a curtain coating method, a die coating method, a spraying method, printing method, or the like. If a film organic material is used, the insulating layer 18c can be formed by a lamination method, a pressing method, or the like.

Figure 16A:
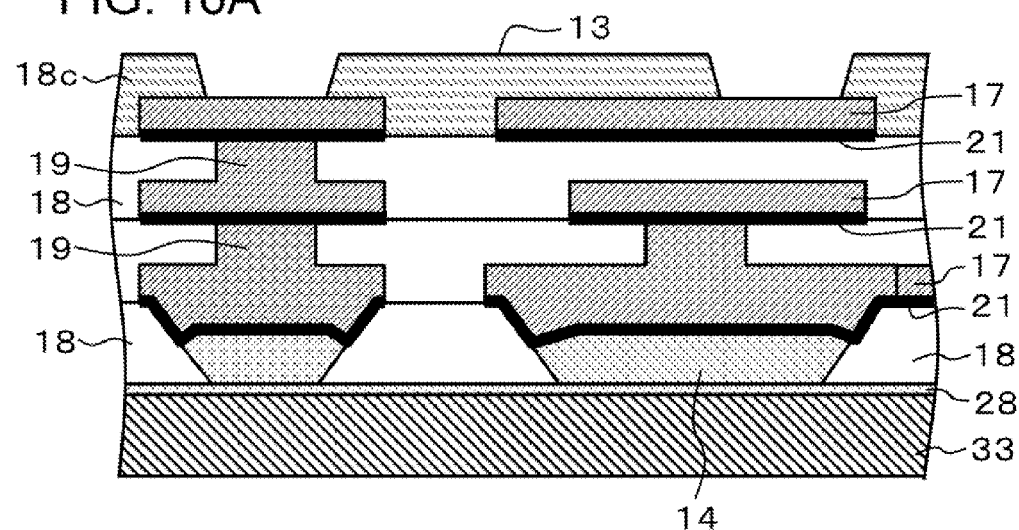
FIGS. 16A and 16B are schematic sectional views of a second step of the wiring board manufacturing method according to example 7 of the present invention.

Next, openings for the second terminals (15 in FIG. 16B) are formed in the insulating layer 18c (see step B3 in FIG. 16A). If a photosensitive organic material is used for the insulating layer 18c, the openings in the insulating layer 18c where the second terminals 15 are formed can be formed by a photolithography method. If a nonphotosensitive organic material or a photosensitive organic material having a low pattern resolution is used for the insulating layer 18c, the openings in the insulating layer 18c can be formed by a laser processing method, a dry etching method, or a blasting method. In example 7, since photosensitive polyimide resin with a thickness of 7 μm is used, a photolithography method is employed to form the openings.

Figure 16B:
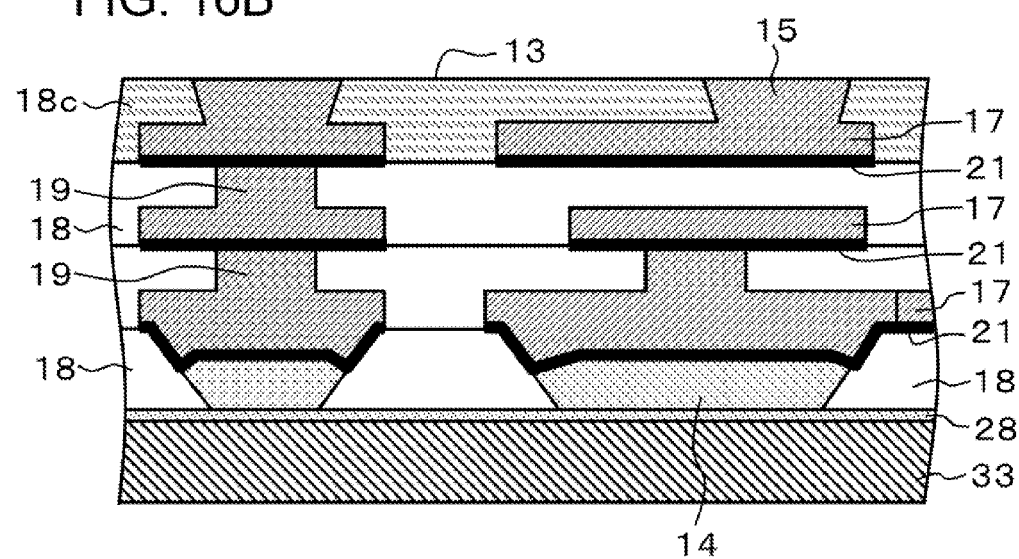

Next, the second terminals 15 are formed in the openings of the insulating layer 18c (see step B4 in FIG. 16B). In light of concentration of stress, formation of a bonded interface with the wiring layer 17 exposed from the openings of the insulating layer 18c needs to be avoided. Thus, it is desirable that the second terminals 15 be formed by using materials similar to those of the conductor film 28 as an underlying layer (for example, copper, aluminum, palladium, gold, platinum, silver, or an alloy of these materials) and by using an electrolytic plating method. In this step, the second terminals 15 may be formed to have the same surface level as the second surface 13 formed by the insulating layer 18c. The second terminals 15 may be formed to be depressed from the second surface 13, by ending deposition of the plating before the second terminals 15 reaches the second surface 13. Alternatively, the second terminals 15 may be formed to protrude from the second surface 13, by continuously depositing plating until the second terminals 15 exceed the second surface 13.

Next, by carrying out the steps similar to steps A15 to A16 of example 6, the support 33 and the conductor film 28 are removed.

According to example 7, the wiring board according to example 3 (see FIG. 7) can be manufactured efficiently.

Example 8

A semiconductor device manufacturing method according to example 8 of the present invention will be described with reference to the drawings. FIGS. 17 to 19 are schematic sectional views of steps of the semiconductor device manufacturing method according to example 8 of the present invention.

The semiconductor device manufacturing method according to example 8 is a method for manufacturing the semiconductor devices according to examples 4 and 5 (see FIGS. 8 and 9). Between steps described below, plasma, cleaning, or thermal treatment shall be implemented when appropriate.

First, by carrying out steps A1 to A14 (see FIGS. 10A to 14A) of example 6, an intermediate body of the wiring board 11 is prepared (see step C1 in FIG. 17A). The wiring board 11 can be manufactured based on the wiring board manufacturing method according to example 6 or 7.

Next, a solder 23a is formed on the second surface 13, and a semiconductor element 22a is flip-chip connected to the wiring board 11 (see step C2 in FIG. 17B). If connection strength is insufficient, a gap between the second surface 13 and the semiconductor element 22a is filled with an underfill 24a. The solder 23a can be made of tin, lead, indium, zinc, gold, or an alloy of these materials. The material for the solder 23a can be suitably selected from lead-tin eutectic solder materials or lead-free solder materials. The solder 23a is formed on an electrode of the semiconductor element 22a by a plating method, a ball transfer method, or a printing method. The underfill 24a is made of epoxy-type material and is applied when or after the semiconductor element 22a is mounted.

While the semiconductor element 22a is flip-chip connected in FIG. 17B, the semiconductor element 22a may be connected by a bonding wire, as in the semiconductor device according to example 5 (see FIG. 9). To connect the semiconductor element 22a by a bonding wire, the back surface of the semiconductor element (22 in FIG. 9) is bonded to the second surface (13 in FIG. 9) with the adhesive material (26 in FIG. 9), and an electrode (not illustrated) of the semiconductor element (22 in FIG. 9) is connected to the second terminal (15 in FIG. 9) by a bonding wire (27 in FIG. 9). The adhesive material (26 in FIG. 9) is applied to a surface where the semiconductor element (22 in FIG. 9) circuit is not formed, and the adhesive material can be made of organic material, Ag paste, or the like. The bonding wire (27 in FIG. 9) can be primarily made of gold.

Next, a mold 31 is formed to cover the semiconductor element 22a, the underfill 24a, and the second surface 13 (see step C3 in FIG. 18A). The mold 31 can be made of a mixture of epoxy-type material and silica filler, and is formed to cover the mounted semiconductor element 22 and the connecting wiring by a transfer molding method using a metal mold, a compression molding method, a printing method, or the like. In FIG. 18A, the mold 31 covers the semiconductor element 22a and the whole surface of one side of the wiring board 11. However, the mold 31 may be formed to cover the semiconductor element 22a and part of the wiring board 11.

Next, the support 33 and the conductor film 28 are removed (see step C4 in FIG. 18B). The support 33 may be removed by a peeling method using a low adhesion layer. Alternatively, a supporting substrate may be peeled by using a transparent substrate and changing properties of the material in contact with the supporting substrate through laser light or ultraviolet light. Further alternatively, a supporting substrate may be polished or separated by using a water cutter or a slicer at a desired position. In example 8, the support 33 is peeled by using lower adhesion between the thermally-oxidized film of the support 33 (silicon) and the conductor film 28 (Cu thin film). If the conductor film 28 remains, the conductor film 28 needs to be removed. The conductor film 28 can be removed by a wet or dry etching method. After etching, the surfaces of the first terminals 14 may be treated by an electrolytic plating method, an electroless plating method, an evaporation method, a printing method, an ink jet method, a dip method, or the like, so that the surfaces of the first terminals 14 are made of at least one kind of metal or an alloy selected from the group consisting of gold, silver, copper, tin, and solder material. The first terminals 14 can be depressed from the first surface 12 by a wet or dry etching method during or after the step of exposing the first terminals 14. In this case, to control the amount of etching, the first terminals 14 may be formed by laminating metals having different etching rates, and the metal exposed on the surface layer may be removed. To allow the first terminals 14 to protrude from the first surface 12, during or after the step of exposing the first terminals 14, the insulating layer 18 may be removed so that the first terminals 14 protrude from the first surface 12. Alternatively, after the first terminals 14 are exposed, a metal film (not illustrated) may be formed by an electrolytic plating method, an electroless plating method, an evaporation method, a printing method, an ink-jet method, a dip method, or the like. In example 8, a gold film is formed on the exposed surfaces (Cu) of the first terminals 14 by an electroless plating method.

Figure 19A:
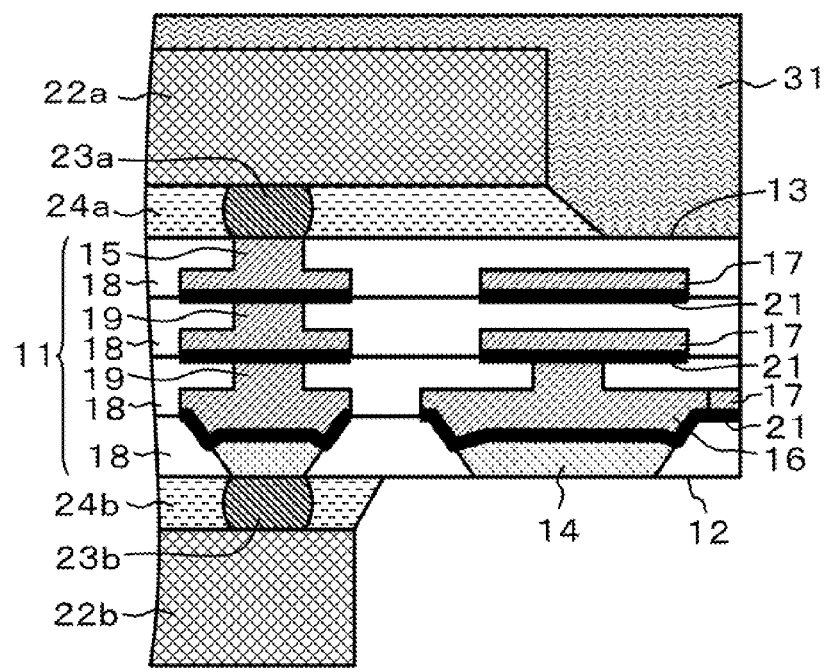
FIGS. 19A and 19B are schematic sectional views of a third step of the semiconductor device manufacturing method according to example 8 of the present invention.

Next, a solder 23b is formed on the first surface 12, and a semiconductor element 22b is flip-chip connected to the wiring board 11 (see step C5 in FIG. 19A). If connection strength is insufficient, a gap between the first surface 12 and the semiconductor element 22b is filled with an underfill 24b.

The solder 23b can be made of tin, lead, indium, zinc, gold, or an alloy of these materials. The material for the solder 23b can be suitably selected from lead-tin eutectic solder materials or lead-free solder materials. The solder 23b is formed on an electrode of the semiconductor element 22b by a plating method, a ball transfer method, or a printing method. The underfill 24b is made of epoxy-type material and is applied when or after the semiconductor element 22b is mounted.

While the semiconductor element 22b is flip-chip connected in FIG. 19A, the semiconductor element 22b may be connected by a bonding wire, as in the semiconductor device according to example 5 (see FIG. 9). To connect the semiconductor element 22b by a bonding wire, the back surface of the semiconductor element (22 in FIG. 9) is bonded to the second surface (13 in FIG. 9) with the adhesive material (26 in FIG. 9), and an electrode (not illustrated) of the semiconductor element (22 in FIG. 9) is connected to the second terminal (15 in FIG. 9) by a bonding wire (27 in FIG. 9). The adhesive material (26 in FIG. 9) is applied to a surface where the semiconductor element (22 in FIG. 9) circuit is not formed, and the adhesive material can be made of organic material, Ag paste, or the like. The bonding wire (27 in FIG. 9) can be primarily made of gold.

Figure 19B:
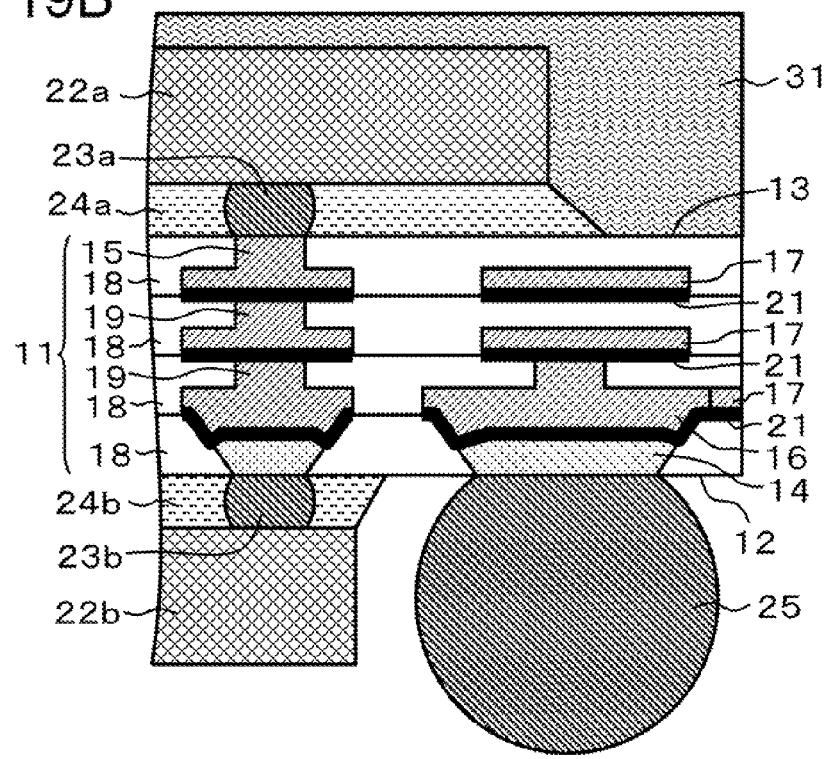

Next, a solder ball 25 is attached to a first terminal 14 (see step C6 in FIG. 19B). The solder ball 25 is attached to mount the semiconductor device on another board (not illustrated). The solder ball 25 is made of solder material and is attached on the first terminal 14 by a ball transfer method or a printing method. Instead of the solder ball 25, a solder-mounted metal pin may be formed, depending on the installation mode. Even if such solder-mounted metal pin is used, the side of the first terminal 14 has a connecting portion with solder. In FIGS. 17A to 19B, while the solder ball 25 is attached to a first terminal 14 on the first surface 12, the solder ball 25 may be attached to a second terminal 15 on the second surface 13.

According to example 8, the semiconductor devices according to examples 4 and 5 (see FIGS. 8 and 9) can be manufactured efficiently.

Modifications and adjustments of the exemplary embodiments and examples are possible within the scope of the overall disclosure (including claims) of the present invention and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A wiring board in which insulating layers and wiring layers are alternately laminated and the wiring layers are electrically connected to each other by at least one via, the wiring board comprising:
at least one first terminal arranged in a first surface and embedded in a first insulating layer among the insulating layers;
at least one second terminal arranged in a second surface opposite to the first surface and embedded in a second insulating layer among the insulating layers; and
at least one land arranged in an intermediate insulating layer among the insulating layers and in contact with the at least one first terminal,
wherein the at least one via electrically connects the at least one land and the wiring layers laminated alternately with the insulating layers, and
wherein no connecting interface is formed at a connecting portion of each of the at least one via to the at least one land but a connecting interface is formed at a connecting portion of each of the at least one via to at least one of the wiring layers.

2. The wiring board according to claim 1, wherein the at least one via electrically connects the wiring layers and each of the at least one via has a bonded interface only at an end thereof on a side closest to the second surface.

3. The wiring board according to claim 1,
wherein each of the at least one first terminal has a surface area exposed on the first surface and a cross-section area in contact with a corresponding land of the at least one land thereabove, and
wherein the surface area is smaller than the cross-section area.

4. The wiring board according to claim 1,
wherein each of the at least one second terminal is formed directly on one of the wiring layers,
wherein each of the at least one second terminal has a surface area exposed on the second surface and a cross-section area in contact with a corresponding wiring layer of the wiring layers thereon, and
wherein the surface area is larger than the cross-section area.

5. The wiring board according to claim 1, wherein the insulating layers are made of one kind of or a plurality of kinds of insulating material.

6. The wiring board according to claim 1, wherein the insulating layers are made of a plurality of kinds of insulating material, and the first insulating layer and the second insulating layer are made of an identical insulating material.

7. The wiring board according to claim 1, wherein the at least one first terminal and the at least one second terminal are each formed by laminating a plurality of metals.

8. The wiring board according to claim 1, wherein each of the at least one second terminal is depressed from a surface of the second insulating layer.

9. The wiring board according to claim 1, wherein each of the at least one second terminal protrudes from the second surface of the second insulating layer.

10. A semiconductor device, comprising the wiring board according to claim 1, wherein at least one semiconductor element is mounted on at least one of a side corresponding to the first surface and a side corresponding to the second surface of the wiring board.

11. The semiconductor device according to claim 10, wherein the at least one semiconductor element is mounted on the wiring board by at least one of a flip-chip connection and a wire bonding connection.

12. A semiconductor device, comprising the wiring board according to claim 1, wherein semiconductor elements are mounted on a side corresponding to the first surface and a side corresponding to the second surface of the wiring board by a flip-chip connection and wherein opposite electrodes of the semiconductor elements mounted on a side corresponding to the first surface and a side corresponding to the second surface are mainly connected by an accumulation of the at least one via in the wiring board.

13. A wiring board in which insulating layers and wiring layers are alternately laminated and the wiring layers are electrically connected to each other by at least one via, the wiring board comprising:
at least one first terminal arranged in a first surface and embedded in a first insulating layer among the insulating layers;
at least one second terminal arranged in a second surface opposite to the first surface and embedded in a second insulating layer among the insulating layers; and
at least one land arranged in an intermediate insulating layer among the insulating layers and in contact with the at least one first terminal,
wherein the at least one via electrically connects the at least one land and the wiring layers laminated alternately with the insulating layers,
wherein no connecting interface is formed at a connecting portion of each of the at least one via to the at least one land but a connecting interface is formed at a connecting portion of each of the at least one via to at least one of the wiring layers,
wherein the wiring board further comprises at least one adhesion layer, each of the at least one adhesion layer formed on a surface of each of the wiring layers on a side closest to the first surface and each of the at least one adhesion layer causing a wiring layer of the wiring layers and an insulating layer of the insulating layers in contact with an adhesion layer of the at least one adhesion layer to adhere to each other,
wherein the wiring board further comprises at least one second adhesion layer, each of the at least one second adhesion layer formed on a surface of each of the at least one land on a side closest to the first terminal.

* * * * *

UNITED STATES PATENT AND TRADEMARK OFFICE
CERTIFICATE OF CORRECTION

PATENT NO. : 8,552,570 B2
APPLICATION NO. : 12/811733
DATED : October 8, 2013
INVENTOR(S) : Kikuchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 428 days.

Signed and Sealed this
Fifteenth Day of September, 2015

Michelle K. Lee
*Director of the United States Patent and Trademark Office*